United States Patent
Yu et al.

(10) Patent No.: US 9,564,420 B2
(45) Date of Patent: *Feb. 7, 2017

(54) FUNCTIONAL BLOCK STACKED 3DIC AND METHOD OF MAKING SAME

(71) Applicant: Taiwan Semiconductor Manufacturing Company, Ltd., Hsin-Chu (TW)

(72) Inventors: Chen-Hua Yu, Hsin-Chu (TW); Kuo-Chung Yee, Taoyuan (TW); Chih-Hang Tung, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/060,341

(22) Filed: Mar. 3, 2016

(65) Prior Publication Data
US 2016/0190101 A1    Jun. 30, 2016

Related U.S. Application Data

(63) Continuation of application No. 14/469,303, filed on Aug. 26, 2014, now Pat. No. 9,293,437.
(Continued)

(51) Int. Cl.
*H01L 23/00* (2006.01)
*H01L 23/31* (2006.01)
(Continued)

(52) U.S. Cl.
CPC ..... *H01L 25/0657* (2013.01); *H01L 21/76802* (2013.01); *H01L 21/76877* (2013.01); *H01L 21/76898* (2013.01); *H01L 23/3128* (2013.01); *H01L 23/481* (2013.01); *H01L 23/5384* (2013.01); *H01L 23/5389* (2013.01); *H01L 24/81* (2013.01); *H01L 24/92* (2013.01);
(Continued)

(58) Field of Classification Search
CPC .. H01L 24/81; H01L 21/76877; H01L 23/481; H01L 23/5389; H01L 2924/181; H01L 2924/00; H01L 23/3128; H01L 23/5384; H01L 25/0652; H01L 21/768–21/02
See application file for complete search history.

(56) References Cited

U.S. PATENT DOCUMENTS 9,064,936 B2    6/2015   Lin et al.
9,293,437 B2 *  3/2016   Yu .................. H01L 23/3128
(Continued)

*Primary Examiner* — Jasmine Clark
(74) *Attorney, Agent, or Firm* — Slater Matsil, LLP

(57) ABSTRACT

An embodiment device package includes a fan-out redistribution layer (RDL), a device over and bonded to the fan-out RDL, and a molding compound over the fan-out RDL and extending along sidewalls of the device. The device includes a first functional tier having a first metallization layer and a second functional tier having a second metallization layer. The second functional tier is bonded to the first functional tier. The device further includes an interconnect structure electrically connecting the first metallization layer to the second metallization layer. The interconnect structure includes an inter-tier via (ITV) at least partially disposed in both the first functional tier and the second functional tier, and the ITV contacts the first metallization layer.

20 Claims, 17 Drawing Sheets

Related U.S. Application Data

(60) Provisional application No. 61/942,425, filed on Feb. 20, 2014.

(51) Int. Cl.
  *H01L 23/538* (2006.01)
  *H01L 25/065* (2006.01)
  *H01L 21/768* (2006.01)
  *H01L 23/48* (2006.01)
  *H01L 25/00* (2006.01)

(52) U.S. Cl.
  CPC .......... *H01L 25/0652* (2013.01); *H01L 25/50* (2013.01); *H01L 21/76805* (2013.01); *H01L 24/80* (2013.01); *H01L 2224/04105* (2013.01); *H01L 2224/08145* (2013.01); *H01L 2224/09181* (2013.01); *H01L 2224/12105* (2013.01); *H01L 2224/16225* (2013.01); *H01L 2224/24137* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/8001* (2013.01); *H01L 2224/80896* (2013.01); *H01L 2224/80948* (2013.01); *H01L 2224/9202* (2013.01); *H01L 2224/94* (2013.01); *H01L 2225/0651* (2013.01); *H01L 2225/06513* (2013.01); *H01L 2225/06541* (2013.01); *H01L 2225/06555* (2013.01); *H01L 2225/06568* (2013.01); *H01L 2225/1035* (2013.01); *H01L 2225/1041* (2013.01); *H01L 2225/1058* (2013.01); *H01L 2924/13091* (2013.01); *H01L 2924/15311* (2013.01); *H01L 2924/181* (2013.01); *H01L 2924/19105* (2013.01)

(56) References Cited

U.S. PATENT DOCUMENTS

| | | |
|---|---|---|
| 2009/0045487 A1 | 2/2009 | Jung |
| 2013/0037929 A1 | 2/2013 | Essig et al. |
| 2013/0161833 A1 | 6/2013 | Pendse |

* cited by examiner

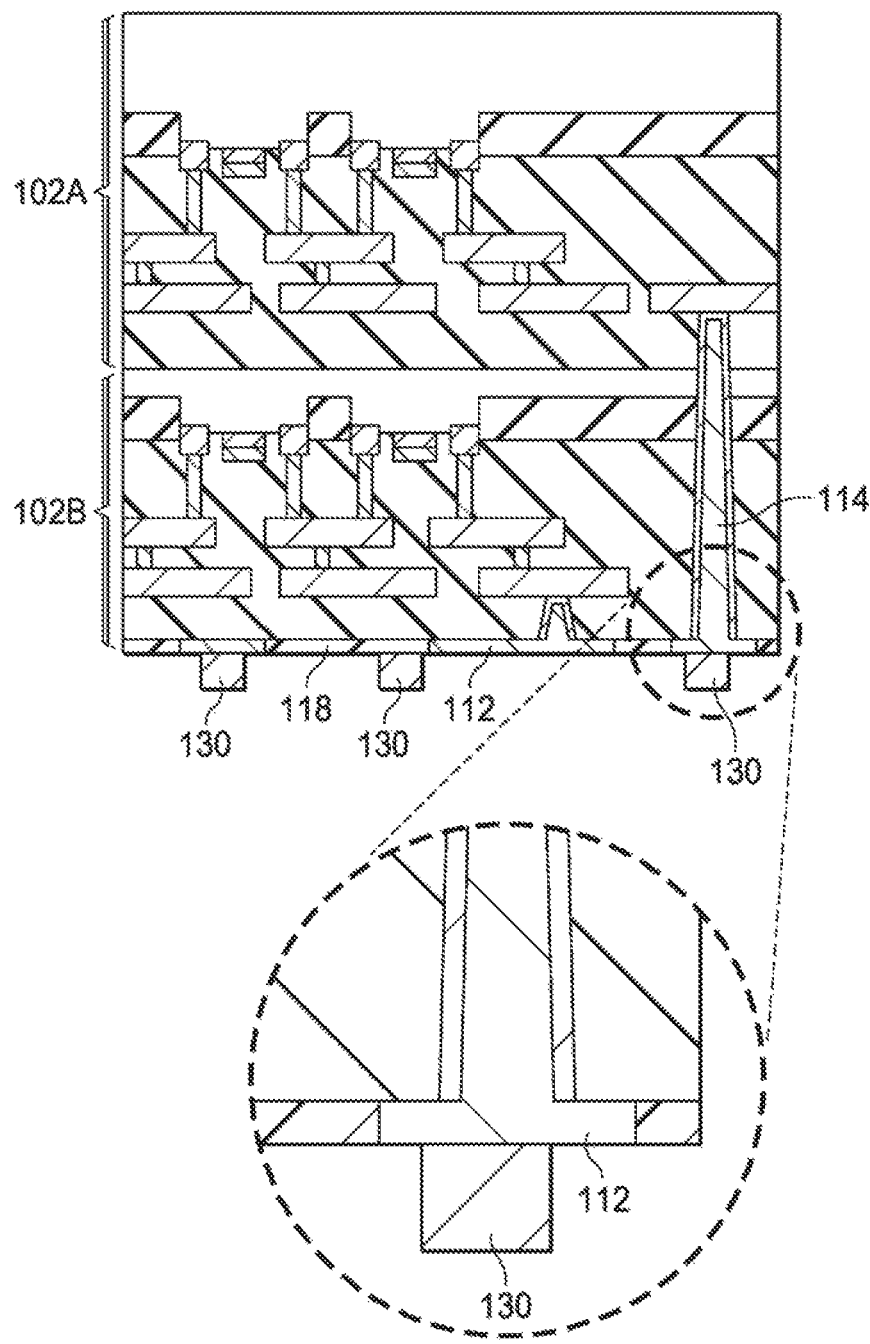

FUNCTIONAL BLOCK STACKED 3DIC AND METHOD OF MAKING SAME

PRIORITY CLAIM AND CROSS-REFERENCE

This application is a continuation of U.S. application Ser. No. 14/469,303, filed Aug. 26, 2014, now U.S. Pat. No. 9,293,437, which claims the benefit of U.S. Provisional Application No. 61/942,425, filed on Feb. 20, 2014, entitled "3D IC Package Method of Making the Same," which applications are hereby incorporated herein by reference.

BACKGROUND

Conventionally, integrated circuit chips are interconnected using so-called two dimensional, or 2D, connections. For advanced devices, such as system on chip (SoC) devices having large layouts with numerous functional blocks (e.g., logic, I/O, memory, analog circuits, and the like) conventional 2D wiring has numerous limitations. These include I/O limitations because of the large number of interconnects and I/O ports required, power consumption/current leakage associated with 2D wiring, and high costs associated with the 2D wiring. These problems are exacerbated as technology nodes advance to the sub-micron scale, such as the 20 nanometer (N20) node and beyond. Conventional 2D wiring causes yield challenges as well, particularly for advanced node devices, such as field programmable gate arrays (FPGAs) and graphic processing units (GPUs).

So-called 3D wiring, which includes interconnecting multiple chips vertically as well as horizontally on a common substrate, is increasingly desirable for advanced devices. Silicon interposer packages may be employed to interconnect different integrated circuits, such as an advanced logic device and associated memory, such as a DRAM chip. The use of through silicon vias (TSVs) also aids more efficient packaging with 3D packages and allows for wider I/O connections. Such packages open the door for package on package (PoP) devices, such as a DRAM package stacked atop a Logic package. Despite the advantage, interposers introduce their own concerns, such as costs both in terms of the cost of the packaging as well as the size cost, particularly in profile sensitive applications such as mobile device applications. Power consumption of device packages limits higher system integration in mobile computing as well. Likewise, limitation on the I/O interconnect density limits higher system integration in mobile computing. Other challenges exist in packaging and particularly 3D packaging, as well, including the need for appropriate spacing for electrical connections, such as bumps and micro bumps.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 illustrates details of a direct pillar bump on metal trace feature of some embodiments;

DETAILED DESCRIPTION

Figure 1A:
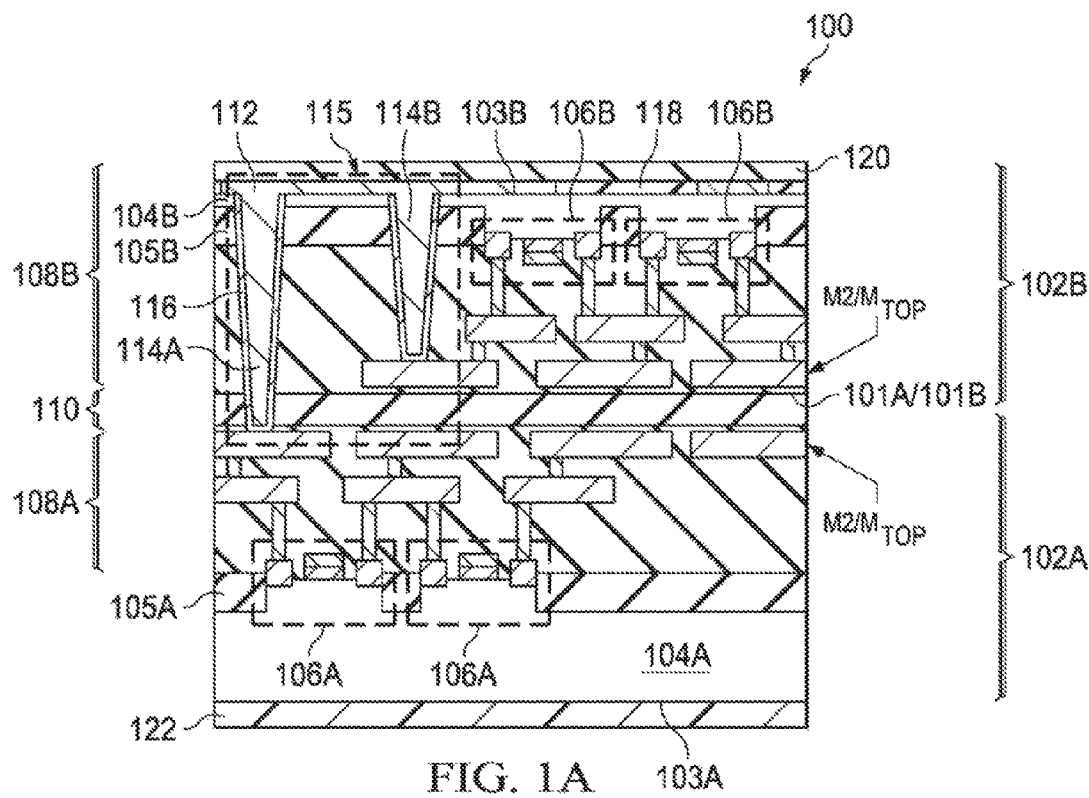
FIGS. 1A and 1B illustrate configurations of a first example embodiment device structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures, unless otherwise indicated. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Before discussing the illustrated embodiments specifically, aspects and advantageous features of the various embodiments are discussed generally in the following paragraphs.

In some aspects, various embodiments may enable lower power and higher input/output (I/O) interconnections for system partition/integration. Higher transistor density in a fixed area may be obtained as well in some embodiments, possibly extending upon the current trend of Moore's law. It is envisioned that embodiments may enable very high I/O homogeneous or heterogeneous stacking with higher yield for advanced node devices (e.g., FPGA, GPU), providing for improved yield and cost performance. Embodiments described herein provide a 3D functional block wafer stacking solution to enhance higher system integration and performance in power consumption, I/O density, and device footprint. For example, a functional block stacked wafer device (sometimes referred to as a monolithic 3D (M3D) integrated circuit) may include two or more stacked functional tiers. Each tier may include a plurality of active devices, which may be electrically interconnected to provide the same (e.g., in homogeneous stacking) or different (e.g., in heterogeneous stacking) functionalities (e.g., logic, memory, external I/O, network connectivity, analog, sensor and the like). Various tiers may be bonded using a bonding layer (e.g., an oxide-to-oxide, SiON-to-SiON, pure Cu-to-Cu, and the like bonding layer), and inter-tier through vias (ITVs) and redistribution layers (RDLs) may provide electrical interconnections across tiers of the device. Various tiers of the device may include an array of interconnected functional circuits, which may allow for various applications, such as, mobile computing, mobile health (e.g., heath monitoring), internet of things (IoT), big data, and the like. The device may further be packaged with other package components, such as, interposers, package substrates, fan-out RDLs, integrated passive devices (IPD), and the like.

Figure 1B:
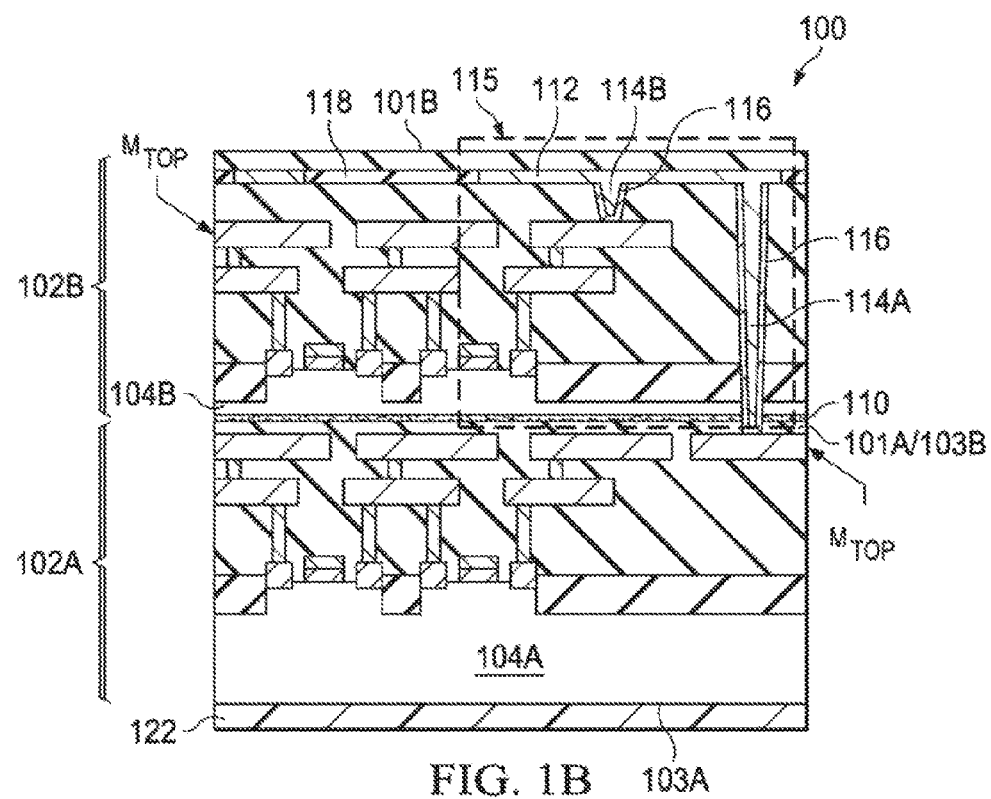

Turning now to the illustrated embodiments, FIGS. 1A and 1B schematically illustrate in cross-sectional view aspects of an embodiment functional block stacked wafer device 100. Device 100 includes functional tiers 102A and 102B, which may or may not provide different electrical functionalities. For example, in homogenous stacks, tier 102A may provide advanced logic functions (central processing unit (CPU), digital signal processing (DSP), and the like) while tier 102 may provide less advanced logic functions (e.g., non-CPU I/O logic). In some embodiments, the advanced logic CPU logic speed may be about 2 gigahertz (GHz) and/or about 32 bit or more, for example. As another example, in heterogeneous stacks, tier 102A may provide logic functionalities while tier 102B may provide non-logic functions, such as memory, analog, sensor, network connectivity, and the like. The configured functionalities of tiers 102A and 102B may vary depending on device design, and the examples provided above are non-limiting.

Tiers 102A and 102B each include a semiconductor substrate 104A and 104B, respectively. Semiconductor substrates 104A and 104B may be bulk silicon substrates although other semiconductor materials including group III, group IV, and group V elements may also be used. Alternatively, substrates 104A and/or 104B may be a silicon-on-insulator (SOI) substrate, a composite substrate, and the like. Furthermore, tier 102A may have a substrate 104A that is of full thickness, which may be in the range of about 750 µm to about 775 µm in the illustrated embodiment, whereas tier 102B (and other higher-level tiers, not shown) may have a substrate 104B thinned down to a range of about 1 µm to about 10 µm in the illustrated embodiment. This thinning allows for improved thermal dissipation and provides for a lower package profile, as well as reducing the depth and width required for through silicon vias (TSVs) passing through substrate 104B.

Active devices 106A and 106B are formed at a front surface of substrates 104A and 104B, respectively. Active devices 106A and 106B may be transistors, such as, complementary metal-oxide-semiconductor (CMOS) transistors, metal-oxide-semiconductor field-effect transistors (MOSFET), fin field-effect-transistors (finFET), combinations thereof and the like. Shallow trench isolation (STI) regions 105A and 105B may be disposed between active devices 106A and 106B, respectively.

Interconnect layers 108A and 108B (also referred to as metallization layers 108A and 108B) are formed over substrates 104A and 104B, respectively. Interconnect layers 108A and 108B may include inter-layer dielectric (ILD) and/or inter-metal dielectric layers (IMD) layers containing conductive features (e.g., conductive lines and vias comprising copper, aluminum, tungsten, combinations thereof, or the like) using any suitable method. The ILD/IMDs may comprise low-k dielectric materials having k values, for example, lower than about 4.0 or even 2.0. Interconnect layers 108A and 108B electrically connect various active devices 106A and 106B, respectively, to form functional circuits within a tier. A top most interconnect layer is designated as $M_{Top}$. In some embodiments, $M_{Top}$ is the interconnect layer within a particular tier that farthest from the substrate (e.g., M2 in the illustrated embodiment). In advanced nodes, $M_{Top}$ may be a higher metallization layer, such as M4 through M10, or even beyond. In FIGS. 1A and 1B, tiers 102A and 102B each include two interconnect layers. However, in alternative embodiments, tiers 102A and 102B may include any number of interconnect layers 108A and 108B, and the number of interconnect layers 108A and 108B in tiers 102A and 102B may or may not be the same.

FIG. 1A illustrates a face-to-face (F2F) embodiment wherein the "face" or "front" surfaces 101A and 101B of tiers 102A and 102B, respectively, are facing each other. The term "face" or "front" surface is a term of art implying the major surface of the device upon which is formed active devices (e.g., active devices 106A/106B) and interconnect layers (e.g., interconnect layers 108A/108B). Likewise, the "back" surface of a chip is that major surface opposite to the face. The "front" surface of device 100 in FIG. 1A has a top layer bonding layer 110, which may be an oxide layer. In some embodiments, bonding layer 110 may comprise silicon oxynitride (SiON), silicon oxide ($SiO_2$), and the like, and in such embodiments, bonding layer 110 may also act as a passivation layer. Other materials (e.g., pure copper) may also be used for bonding layer 110 as will be explained in greater detail in subsequent paragraphs. Bonding layer 110 can be used to bond tier 102A and tier 102B, for example, using a fusion bonding process. Bonding layer 110 may have a thickness of about 0.5 µm to about 10 µm, for example.

Functional circuits (e.g., active devices 106A/106B and interconnect layers 108A/108B) in tiers 102A and 102B are electrically interconnected using interconnect structure 115. Interconnect structure 115 may be an asymmetrical staple-shaped structure, for example, comprising vias 114 (labeled 114A and 114B) electrically connected to metal trace features (e.g., a metal trace portion of RDL 112). RDL 112 is disposed on a back surface of tier 102B, and RDL 112 may include metal trace features formed in in a dielectric layer (e.g., an oxide or nitride layer) 118. Alternatively, layer 118 may be a polymer layer comprising polyimide (PI), polybenzoxazole (PBO), benzocyclobuten (BCB), epoxy, silicone, acrylates, nano-filled pheno resin, siloxane, a fluorinated polymer, polynorbornene, and the like, for example.

Interconnect structure 115 includes an inter-tier via (ITV) 114A contacting a metal trace portion of RDL 112, and a TSV 114B also contacting the metal trace portion of RDL 112. The so-called staple shaped interconnect structure 115 is asymmetrical because ITV 114A extends from RDL 112, through substrate 104B, through interconnect layers 108B, through bonding layer 110, and contacts an $M_{Top}$ layer of tier 102A (e.g., M2 layer of interconnect layers 108A in FIG. 1A). In contrast, TSV 114B extends only from RDL 112 through substrate 104B and contacts an $M_{Top}$ layer of tier 102B (e.g., M2 layer of interconnect layers 108B in FIG. 1A). Although both ITV 114A and TSV 114B terminate at and contact $M_{Top}$ layers in each respective tier 102, in alternative embodiments, other metallization layers (e.g., M1 or any other interconnect layer) could be the termination point for ITV 114A and/or TSV 114B. Furthermore, in the illustrated embodiment, ITV 114A can also be viewed as constituting a combination of aligned features including a TSV feature (extending through substrate 104B) and a through oxide via (TOV) that extends through bonding layers 110. Advantages of using an asymmetrical staple shape for interconnect structure 115 may include, for example, the relaxing of wafer-to-wafer bonding alignment constraints because functional tiers 102A and 102B are bonded by bonding layer 110, which may be substantially or completely free of any electrical connectors (e.g., contact pads, microbumps, controlled collapse chip connection (C4) bumps, and the like) that require precise alignment for electrical connection. Thus, device yield may be improved.

The structure composition of ITV 114A and TSV 114B may be substantially similar. For example, both ITV 114A and TSV 114B may comprise a conductive material (e.g., copper, aluminum, and the like) having a barrier layer 116 disposed on sidewalls of the conductive material. Barrier layer 116 may comprise titanium nitride, titanium oxide, tantalum nitride, tantalum oxide, and the like, for example, and barrier layer 116 may act as an isolation layer for ITVs/TSVs 114.

Additional features may be disposed on a back surface of tiers 102A and 102B. For example, as illustrated by FIG. 1A, a thermal dissipation layer 122 may be disposed on a back surface of tier 102A. Thermal dissipation layer 122 may comprise a thermal interface material (TIM), for example, a polymer having a good thermal conductivity, which may be between about 3 watts per meter kelvin (W/m·K) to about 5 W/m·K or more. Thermal dissipation layer 122 may further comprise high thermal conductivity feature having a thermal conductivity, for example, between about 200 watts per meter kelvin (W/m·K) to about 400 W/m·K or more, and may be formed using a metal, a metal alloy, and the like.

Furthermore, another bonding layer 120 may be disposed over a back surface of tier 102B (e.g., over RDL 112). Bonding layer 120 may allow additional tiers (not shown) to be bonded to tier 102B. For example, bonding layer 120 may be bonded to another oxide layer or a nitride layer (e.g., silicon nitride) of another tier. In such embodiments, the bonded layers (including bonding layer 120) may have a total thickness of about 0.25 μm to about 1.5 μm, for example. The additional tiers 102 may provide the same or different functionalities as tiers 102A and/or 102B, and interconnect structures similar to interconnect structure 115 may provide electrical connections between the additional tiers and tiers 102A/102B. In some embodiments, bonding layer 120 may also function as a passivation layer. Alternatively, bonding layer 120 may be replaced by another thermal dissipation layer (e.g., in device dies having only two tiers).

FIG. 1B illustrates an embodiment wherein tier 102A and tier 102B are mounted in a face to back (F2B) configuration. For example, the front surface 101A of substrate 104A is facing a back surface 103B of substrate 104B. Furthermore, this configuration illustrates a different asymmetrical staple vias 114A/114B on metal trace configuration for interconnect structure 115. Note in this embodiment, RDL 112 is formed on a face surface of tier 102B while the back surface of tier 102B is mounted to the face surface of tier 102A using bonding layer 110. In this embodiment, interconnect structure 115 includes a TOV 114B extending from $M_{Top}$ of tier 102B (e.g., M2 in interconnect layers 108B) to a metal trace portion of RDL 112. Interconnect structure 115 further includes an ITV 114A extending from the metal trace portion of RDL 112 through interconnect layers 108B, substrate 104B, and bonding layer 110 to contact $M_{Top}$ layer of tier 102A (e.g., M2 in interconnect layers 108A). In other embodiments, TOV 114B and ITV 114A may contact with any metallization layer in tiers 102B and 102A, respectively.

TOV 114B and ITV 114A may be substantially similar in structure. However, TOV 114B may not extend through any silicon layers (e.g., TOV 114B may only extend through dielectric layers, not substrate 104). Thus, barrier layer 116 for TOV 114B may be omitted in some embodiments as the dielectric layers may provide sufficient isolation and anti-diffusion properties without a separate barrier layer. In other embodiments, TOV 114B may include barrier layer 116.

Although device 100 is illustrated as have only a few TSVs, TOVs, and/or ITVs 114, device 100 may include any number of such interconnect structures. For example, in high density applications, the total number of vias 114 in various interconnect structures 115 may be about 20,000 or more. In such embodiments, the critical dimensions of such vias 114 may be between about 0.5 μm and about 5 μm.

Figure 2A:
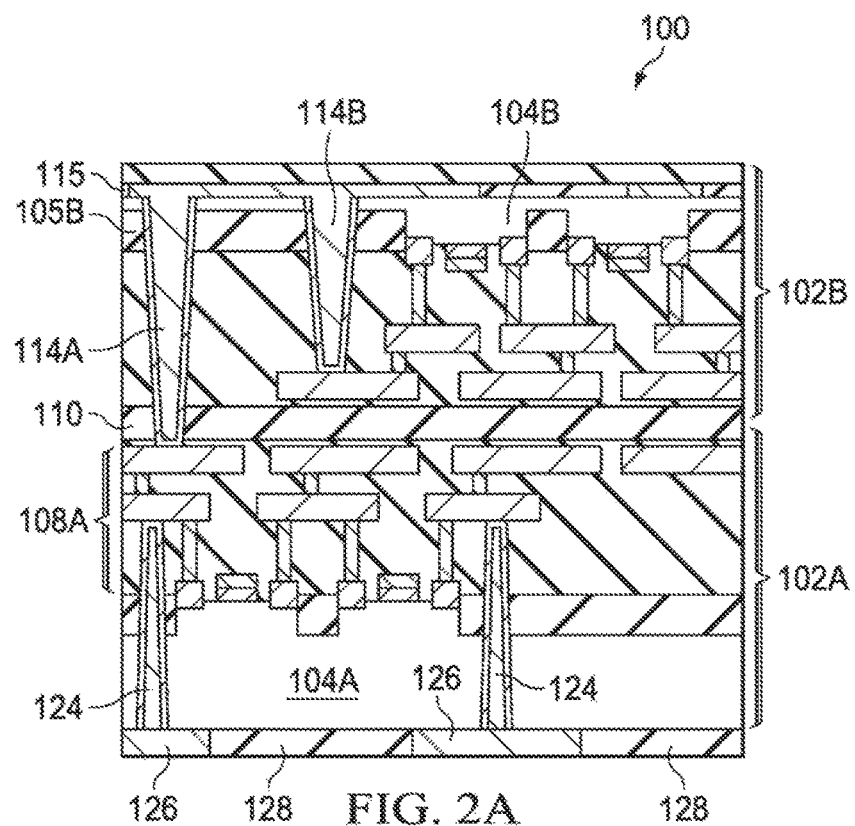
FIGS. 2A and 2B illustrate configurations of a second example embodiment device structure.
Figure 2B:
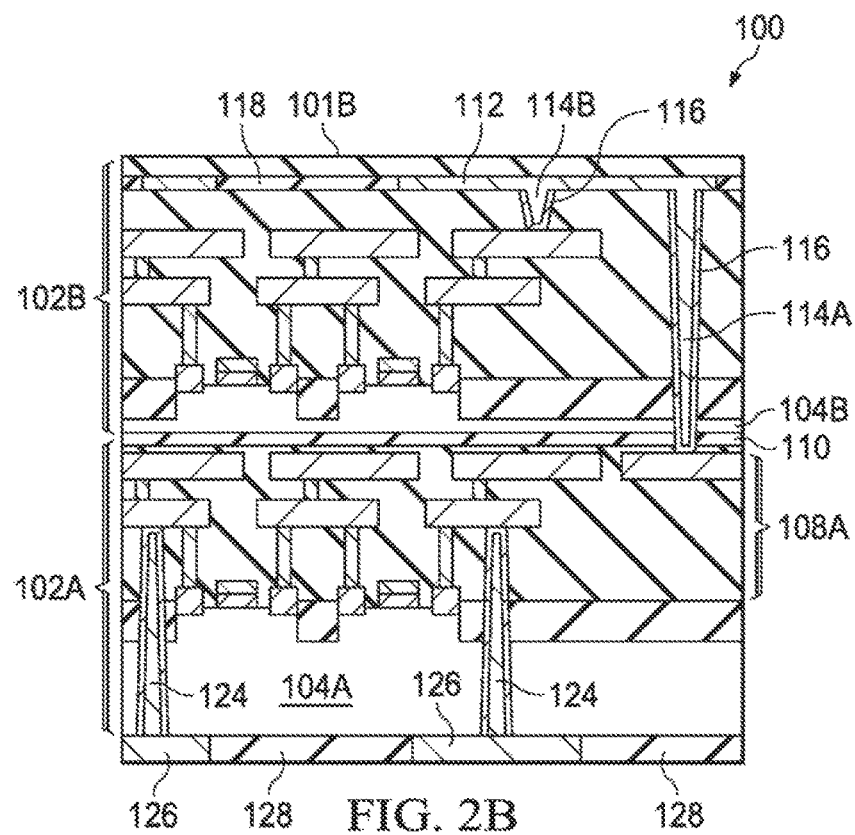

FIGS. 2A and 2B illustrate another embodiment of device 100, with FIG. 2A illustrating a F2F configuration and FIG. 2B illustrating a F2B configuration. In the embodiment of FIG. 2A, an asymmetrical staple shaped on metal trace feature interconnect structure 115, similar to that illustrated in FIG. 1A, is shown. In this embodiment, however, TSVs 124 are also employed to provide yet further interconnection to a back surface of tier 102A. In the illustrated embodiment, two such TSVs 124 are shown extending from a metallization layer (e.g., the bottom most or M1 layer of interconnect layers 108A, although other metallization layers could be employed) of tier 102A, through substrate 104A, and contacting a contact pad 126 (or perhaps another RDL in other embodiments) formed on the back surface of substrate 104A. Passivation layer 128 may be disposed between contact pads 126. Additional backside interconnect structures (not shown) may be formed on the back surface of substrate 104A, for example, providing I/O contact pads. Although two such TSVs 124 are illustrated, any number of such TSVs 124 is contemplated herein. FIG. 2B illustrates a device die including an asymmetrical staple shaped interconnect structure 115, similar to that illustrated in FIG. 1B, in combination with two TSVs 124 similar to those illustrated in FIG. 2A.

Furthermore, although the illustrated shape of TSVs 124 imply a via-last formation approach where TSVs 124 are patterned and filled after other features of tier 102A are formed, other formation approaches may also be used. For example, TSVs 124 may be formed in a via-middle approach where TSVs 124 are formed after the formation of ILD over active devices 106A, but prior to the formation of various metallization layers (e.g., M1). In such embodiments, a shape of TSVs 124 may be reversed from that illustrated in FIGS. 2A and 2B. For example, the widest part of TSVs 124 may contact the metallization layer while the narrowest part of TSVs 124 may be disposed on a back surface of substrate 104A.

Figure 3A:
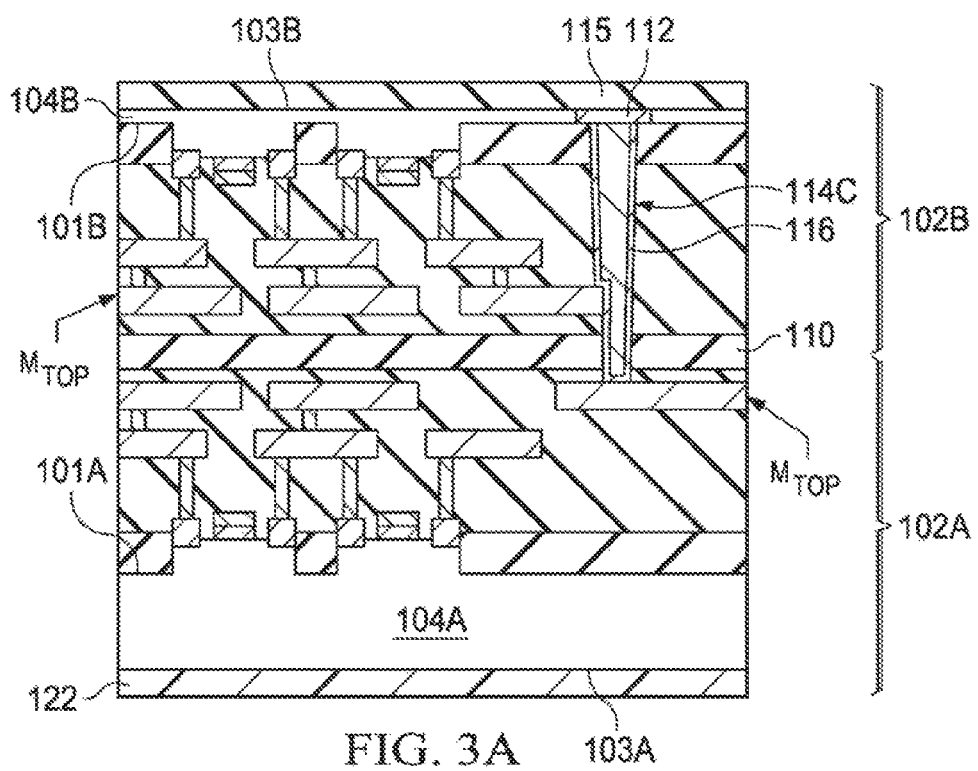
FIGS. 3A through 3C illustrate configurations of a third example embodiment device structure.
Figure 3B:
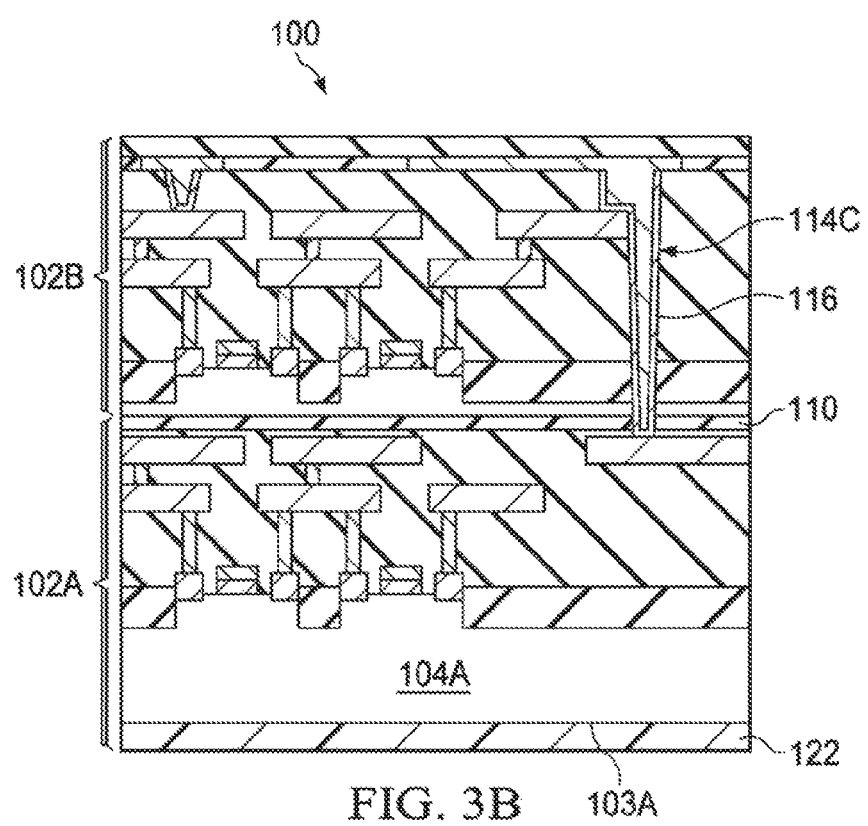
Figure 3C:
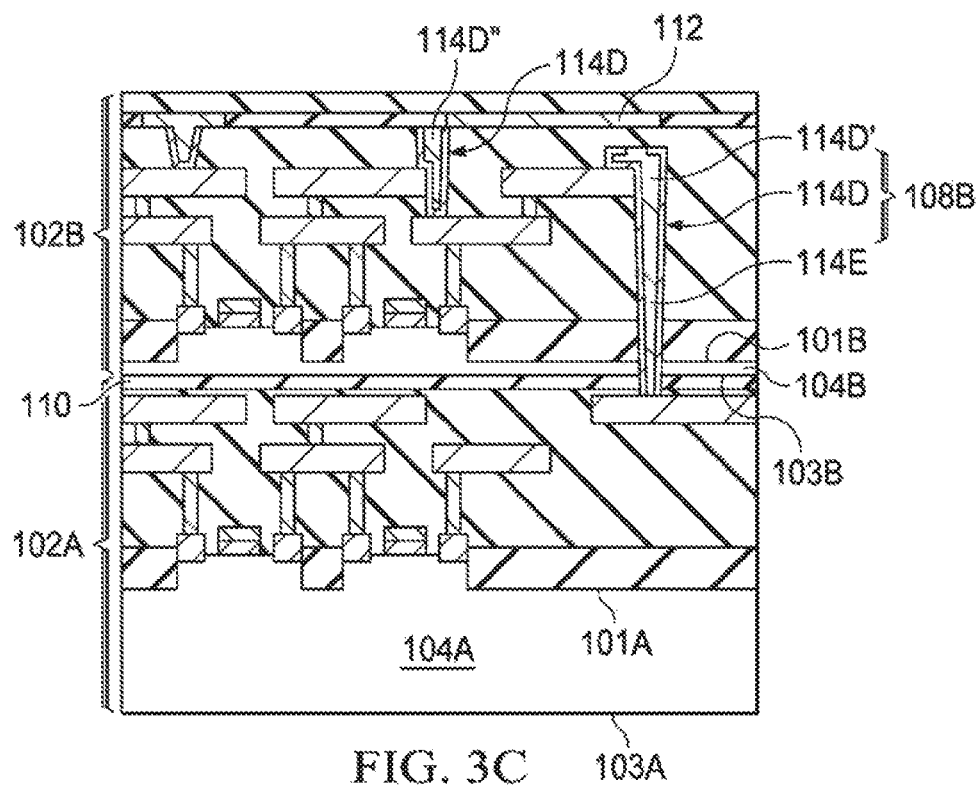

FIGS. 3A through 3C illustrate embodiments with self-aligned ITVs 114C and/or 114D, which vias may be formed of copper and/or copper alloys in some embodiments. With reference to FIG. 3A, a F2F configuration is illustrated. Interconnect structure 115 includes an ITV 114C, which may electrically connect to and contact metallization layers in both tiers 102A and 102B (e.g., $M_{Top}$ layers in both tiers). As illustrated, ITV 114C is self-aligned to corresponding features in the metallization layers to which it is electrically connected. For example, ITV 114C may be a butt contact formed having a first portion that lands on a first metal line in a first metallization layer (e.g., metal line in $M_{Top}$ in tier 102B) and a second portion that extends past an edge of the first metal line to land on a second metal line in a second metallization layer (e.g., metal line in $M_{Top}$ in tier 102A). In some embodiments, ITV 114C may be patterned using a single photomask (see FIGS. 5A through 5B). FIG. 3B illustrates another configuration, in this case a F2B configuration, having an ITV 114C in a substantially similar configuration as that illustrated in FIG. 3A. Self-aligned ITVs 114C may decrease the total routing distance between tiers (e.g., by removing the routing distance of a second via), which may decrease power consumption and signaling time in device 100.

FIG. 3C illustrates another configuration of a F2B configuration having ITVs 114D. ITVs 114D includes a buried ITV portion 114D' electrically connecting and contacting metallization layers of both tiers 102A and 102B (e.g., $M_{Top}$ layers of both tiers). Buried ITV portion 114D' may not directly contact RDL 112. Rather, electrical connection to RDL 112 may be made through interconnect structures 108B within tier 102B and self-aligned TOV portion 114D" of ITV 114D. TOV portion 114D" may electrically connect and contact RDL 112 and metal trace portions of interconnect layers 108B, which may electrically connect TOV portion 114D" with buried ITV portion 114D'. Buried ITV 114D may relax routing and design constraints of direct connections to RDL 112, which may allow for increased density of interconnect structures in device 100.

Other configuration of device 100 will be apparent to those skilled in the art using routine experimentation once informed by the present disclosure. For example, while only two tiers (e.g., tiers 102A and 102B) are shown, and while each chip has only a set number of elements (e.g., two active devices, two metallization layers, one RDL, and the like) in the illustrated embodiments, this is intended to be illustrative and not limiting. One skilled in the art will recognize that device 100 may include multiple stacked tiers, one or more of the functional tiers 102 having any practical number of elements (e.g., active devices, metallization layers, RDLs, and the like). As another example, an embodiment device may include tier 102A and tier 102B are mounted in a back to back (B2B) configuration. In such configurations, a back surface of tier 102A may be bonded to a back surface of tier 102B.

As yet another example, bonding layer 110 may comprise materials other than an oxide. For example, bonding layer 110 may comprise substantially pure copper. In such embodiments, the pure copper layer may function as a bonding layer, rather than an interconnect layer. Advantageous features of pure copper bonding may include one or more of: thermal dissipation (e.g., hot spot heat fluctuations may be efficiently spread in a radial direction though the copper bonding interface to mitigate hot spots), providing a common grounding plane for electrostatic discharge (ESD) control, electromagnetic shielding, high frequency signaling ground, and the like. Furthermore, in such embodiments, barrier layer 116 for ITVs 114A may comprise a dielectric barrier layer to electrically isolate ITVs 114A from bonding layer 110 and/or other ITVs 114A in the device die. The dielectric barrier layer may comprise a low-k dielectric, such as, silicon oxide, silicon nitride, silicon carbide, silicon oxynitride, and the like. In still other embodiments, bonding layer 110 may comprise oxides, poly or single crystal silicon (Si), silicon nitride (SiN), silicon carbide (SiC), titanium (Ti), copper (Cu), titanium nitride (TiN), alloys thereof, or combinations thereof.

Thus, depending on the design of device 100, any number of tiers 102 may be bonded together. Each tier may include active devices (e.g., transistors) that are electrically connected to form functional circuits (e.g., logic, memory, analog, network connectivity, sensor, and the like circuits) within the tier. Interconnect structures comprising ITVs and RDLs may provide electrical connectivity between the tiers so that the functional circuits within a tier may be combined into functional devices (e.g., mobile computing devices, IoT devices, mobile heath devices, big data devices, and the like). Thus, device 100 provide from scalable stacked functional tiers that provide greater design flexibility, improved yield, lower production costs, increased I/O density, increased active device density, and the like.

FIGS. 4A through 4F illustrate intermediary steps in an exemplary process flow for a face-to-face embodiment device 100. Only those steps necessary for understanding the described embodiments are illustrated; one skilled in the art will recognize that many other and additional steps are required for forming a fully functional packaged semiconductor device.

Figure 4A:
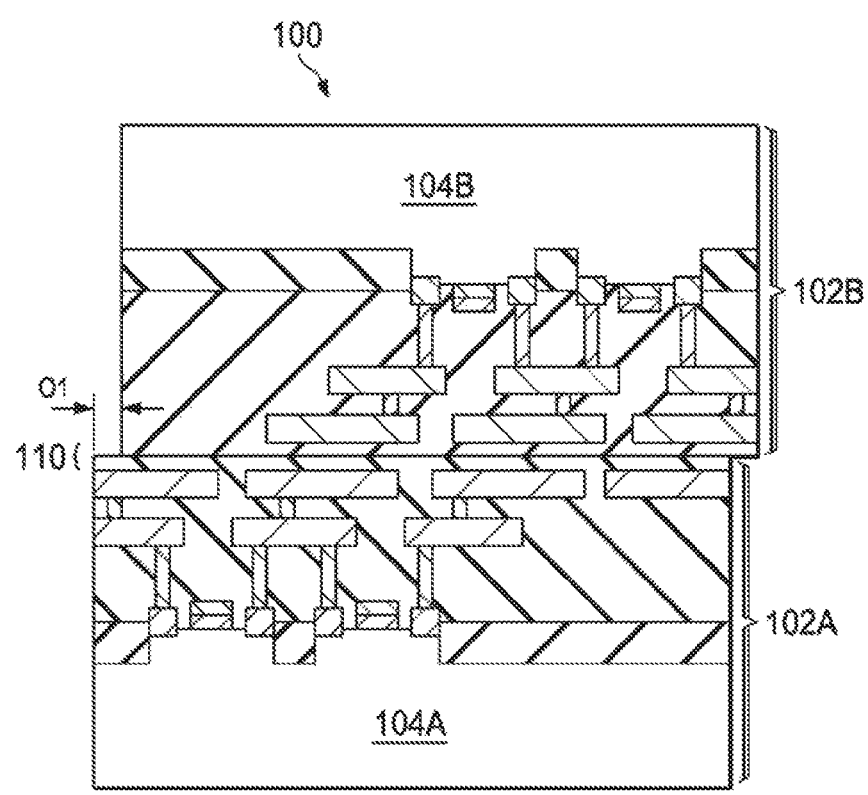
FIGS. 4A through 4F illustrate various intermediary steps in an example process flow for a face to face embodiment device.

In a first illustrated step, two functional tiers 102A and 102B are bonded together, as shown in FIG. 4A. Bonding can be oxide to oxide bonding, wafer to wafer (W2W) bonding, and the like. For example, oxide to oxide bonding may employ a fusion bonding technique to bond tiers 102A and 102B using a bonding layer 110 comprising an oxide. The fusion bonding process may include forming a bonding layer 110 over each tier 102, activating an exposed surface of the bonding layers 110 (e.g., in a plasma process), and cleaning bonding layers 110 after activation. The fusion bonding process may further include contacting the activated surfaces of bonding layers 110 together (e.g., in the F2F configuration illustrated by FIG. 4A) and performing a thermal annealing process to strengthen the oxide bond. Other oxide bonding processes may also be used. In embodiments where bonding layer 110 comprises substantially pure copper, a similar bonding process may be used with adapted cleaning/activation processes. For example, a self-aligned monolayer (SAM) or similar protection layer may be used before bonding.

An advantageous, but not limiting, feature of the illustrated embodiment is that no carrier wafer is required for bonding tiers 102A and 102B. For example, tiers 102A and 102B may be bonded prior to any wafer thinning processes. That is, substrates 104A and 104B may both be full thickness substrates. By bonding tiers 102A and 102B prior to thinning, a carrier may not be required to provide wafer support during bonding. Furthermore, thin wafer handling techniques may not be required because both tiers 102A and 102B are sufficiently thick. The lack of a carrier or thin wafer handling processes may lower manufacturing costs and increase yield. Another advantageous, but not limiting, feature of the illustrated embodiment is improved layer bonding overlay tolerance (e.g., overlay gap O1 may be between about 0.5 µm to about 1.5 µm) as bonded tiers 102A and 102B do not rely on connectors (e.g., microbumps, C4 bumps, or similar connectors) that must be precisely aligned for electrical connection.

Figure 4B:
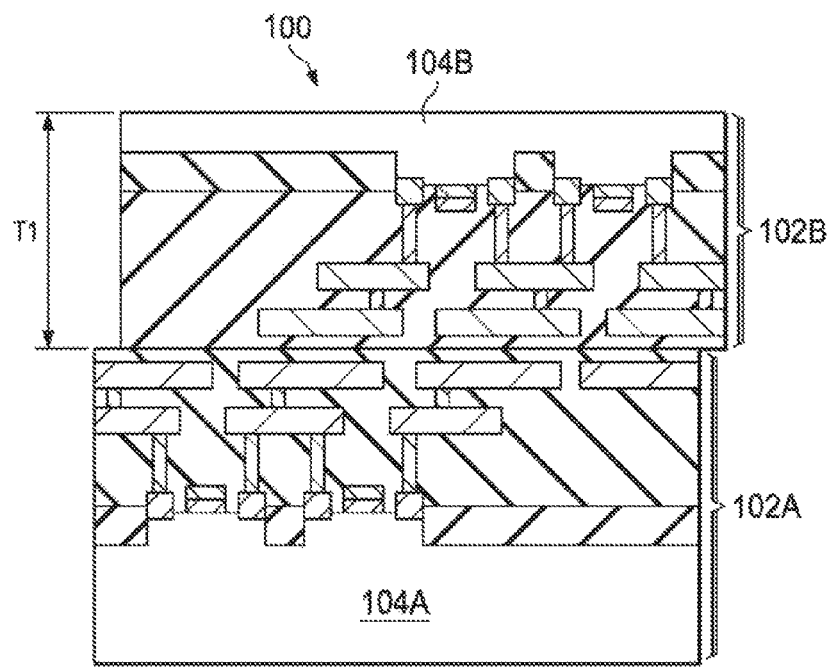

After bonding, tier 102B's substrate 104B is thinned down to reduce package height, as shown in FIG. 4B. The substrate can be thinned so that tier 102B has a thickness T1 of about 0.5 μm to about 10 μm in some embodiments. Thinning can be accomplished, e.g., using mechanical abrasion, polishing, or the like, or using chemical removal, such as a wet etch. A thinning-stop layer (not shown) may be implanted in substrate 104B for thinning stop control. The thinning stop layer may be a dopant layer or an epitaxially grown layer having a thickness of about 0.2 μm to about 10 μm. The thickness of the thinning stop layer may be selected so that it is sufficiently thick to stop the thinning process depending on the employed etching selectivity. For example, if the used etching selectivity is about 1:100, the thinning stop layer may have a thickness between about 0.2 μm to about 5 μm. Other dimensions may be used for the thinning stop layer based on process configuration.

The steps illustrated in FIGS. 4A and 4B may be applied in a similar manner to F2B embodiments. However, in a F2B embodiment, prior to bonding tier 102B may first be a disposed face down on a carrier (not shown) and substrate 104B may be thinned. Subsequently, a bonding layer 110 may be disposed over thinned substrate 104B, and substrate 104B may be bonded to another bonding layer on a face surface of tier 102A. The carrier may then be removed.

Figure 4C:
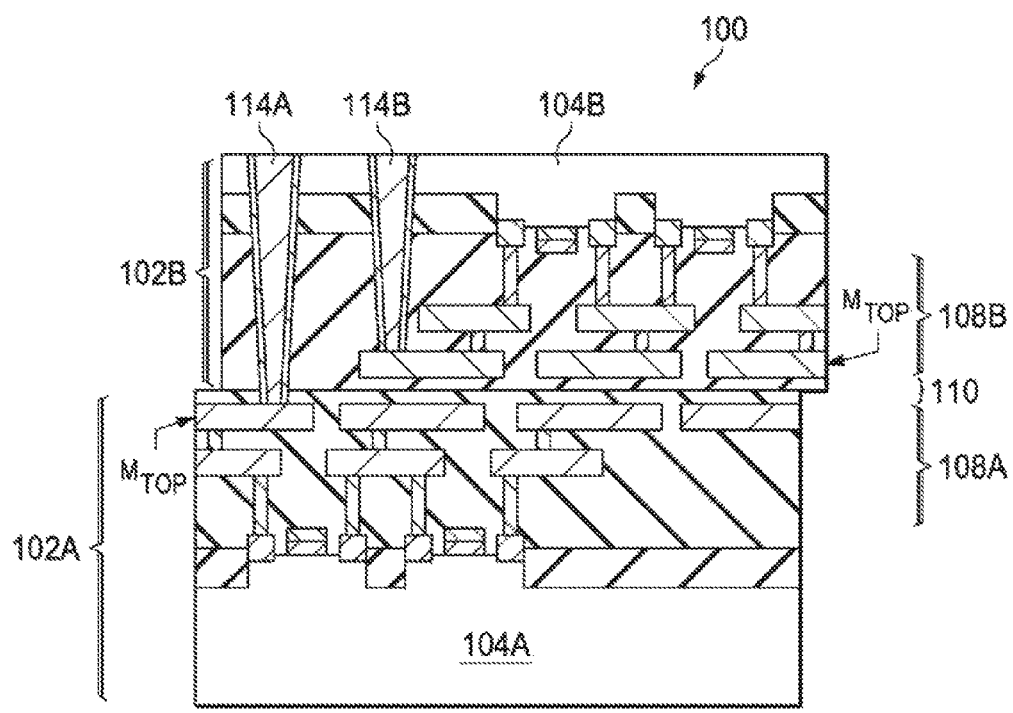

FIG. 4C illustrates a next exemplary process step in which ITVs 114A and/or TSVs 114B are formed using any suitable process that is not repeated here for clarity. The illustrated TSV 114B extends from the back surface of tier 102B to metallization layer $M_{Top}$ (e.g., M2) of tier 102B. Likewise, ITV 114A (labeled as a TSV in FIGS. 4C-4F because it extends through substrate 104B, so it is a TSV as well as being an ITV) extends from the back surface of tier 102B, through interconnect layers 108B of tier 102B, through bonding layers 110, and to a metallization layer $M_{Top}$ of tier 102A. As but one example, the illustrated vias 114A and 114B can have respective diameters of less than about 1.5 μm and an aspect ratio of less than about 10. The narrow diameter of ITV 114A and TSV 114B may be, in some embodiments, enabled by the thinning of substrate 104B, which decreases the amount of semiconductor substrate material (e.g., silicon) that is patterned for forming vias 114. At least in part because the TSV lands on a metallization layer (e.g., M2 of tier 102B), it is contemplated that both the TSV and the ITV can be formed at the same time using common process steps.

Figure 4D:
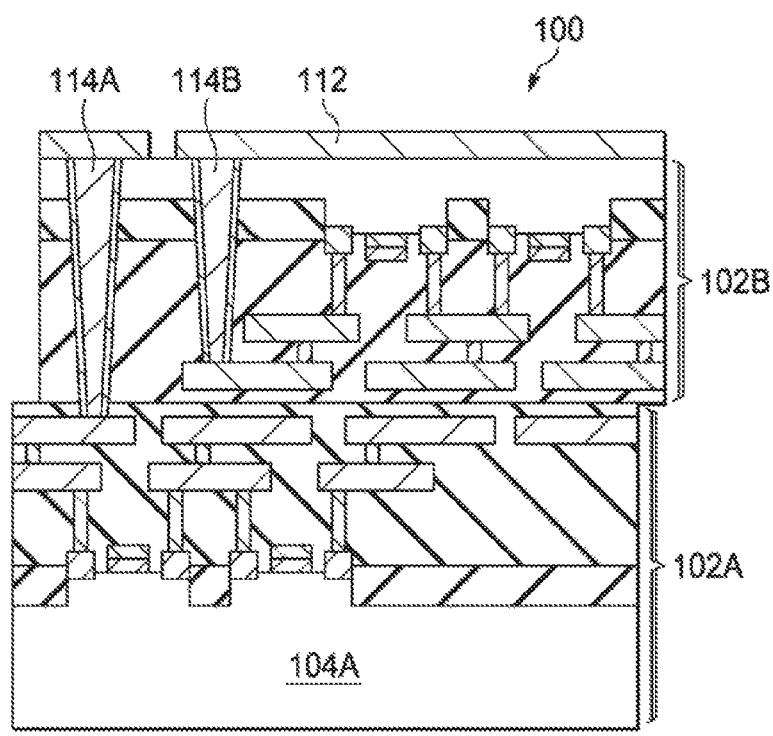
Figure 4E:
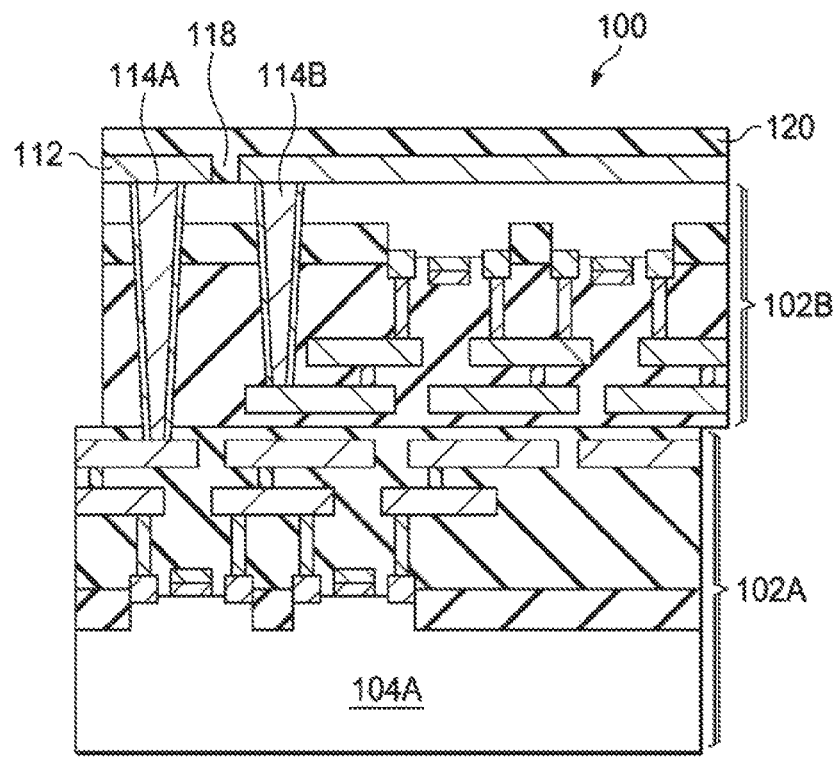

Processing continues with the formation of one or more RDLs 112 on the backside of tier 102B. RDLs 112 are representative of one or more conductive layers that can be stacked atop on another on the surface of the chip. The RDLs 112 are illustrated in FIG. 4D, and FIG. 4E illustrates formation of a passivation layer (SiN, an oxide, polymer, and the like) over the RDL. Top portions of the passivation layer over RDLs 112 may be used as a bonding layer 120 in subsequent process steps. Alternatively, a bonding layer 120 may be formed separately over RDLs 112 and the passivation layer.

Figure 4F:
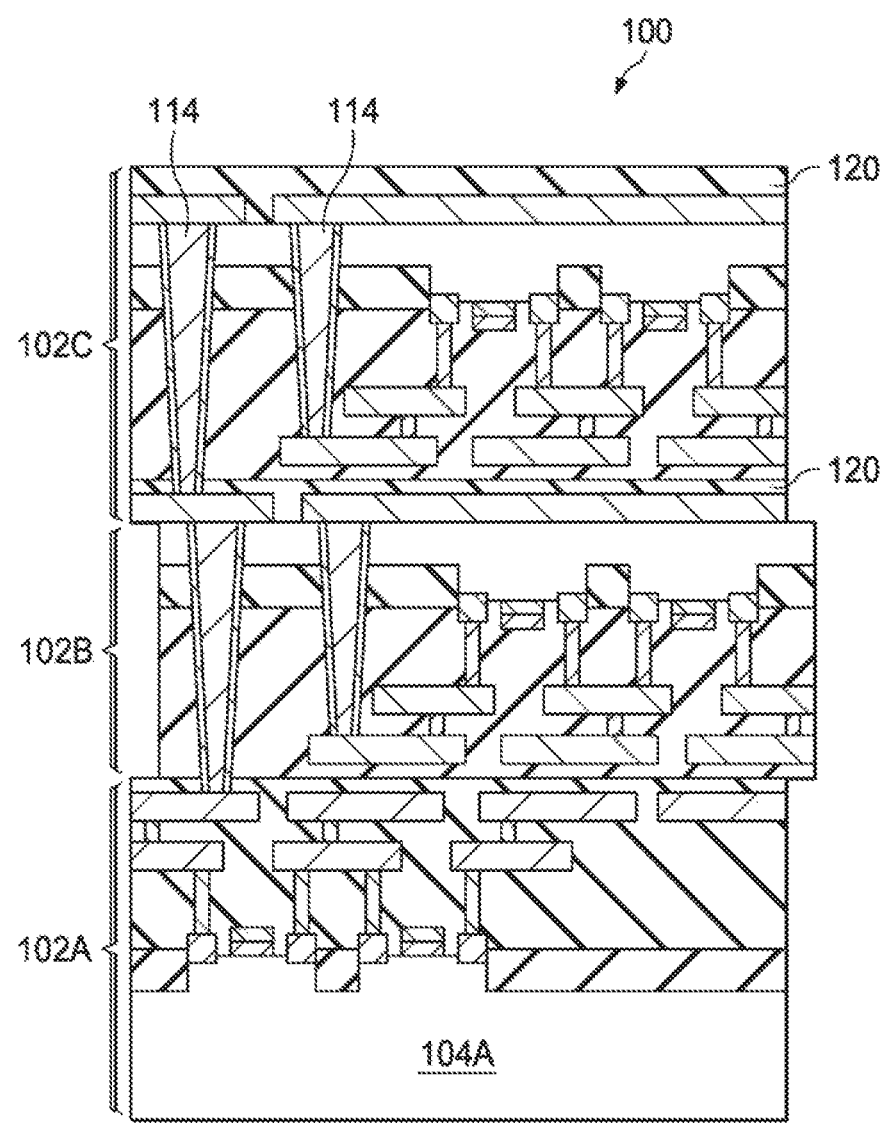

FIG. 4F illustrates a third tier 102C mounted in a F2B configuration to tier 102B, and analogous TSVs and ITVs 114 being formed therein. The bonding of tier 102C may be performed using analogous process steps as those illustrated in FIGS. 4A through 4E, and tier 102C may be bonded without the use of a carrier or thin wafer handling techniques, for example. One skilled in the art will recognize that three, four, or more tiers of chips can be stacked and interconnected by repeating the processes illustrated herein.

Figure 5A:
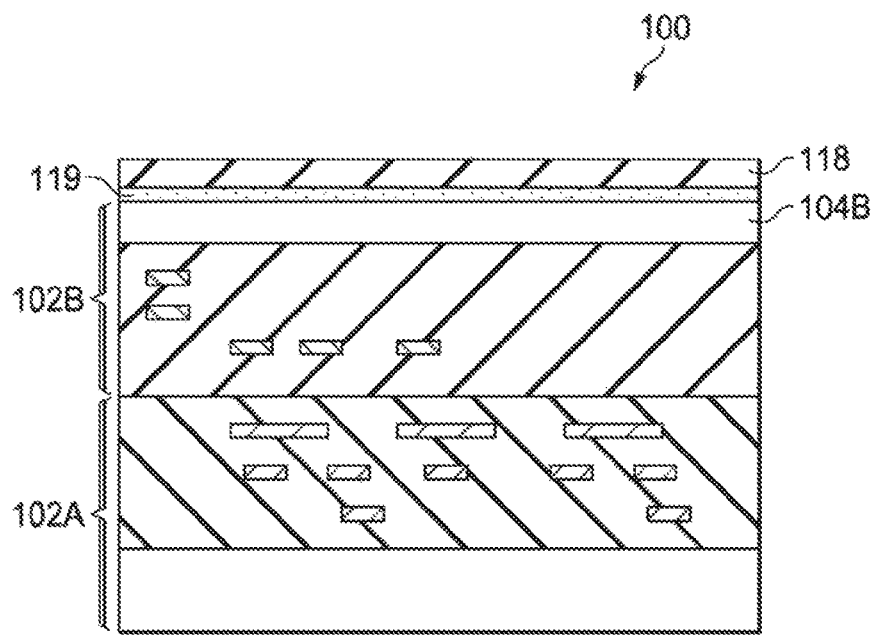
FIGS. 5A through 5F illustrate various intermediary steps in an example process flow forming interconnect structures in an embodiment device.

FIGS. 5A through 5F illustrate various intermediary steps in an example process flow forming interconnect structure 115 in device 100 according to an embodiment. As illustrated by FIG. 5A, functional tiers 102A and 102B are bonded in a F2F configuration, and substrate 104B of tier 102B may be thinned to a desired thickness. The process of bonding and thinning tiers 102A/102B may be done according to the steps illustrated in FIGS. 4A though 4B, for example. Subsequently, dielectric layer 118 may be formed over a back surface of substrate 104B. Various intermediary layers (e.g., a backside anti-reflective coating (BARC) layer 119, etch stop layers, and the like) may be disposed substrate 104B and dielectric layer 118. The intermediary layers may aid in patterning processes (e.g., photolithography processes) of subsequent steps.

Figure 5B:
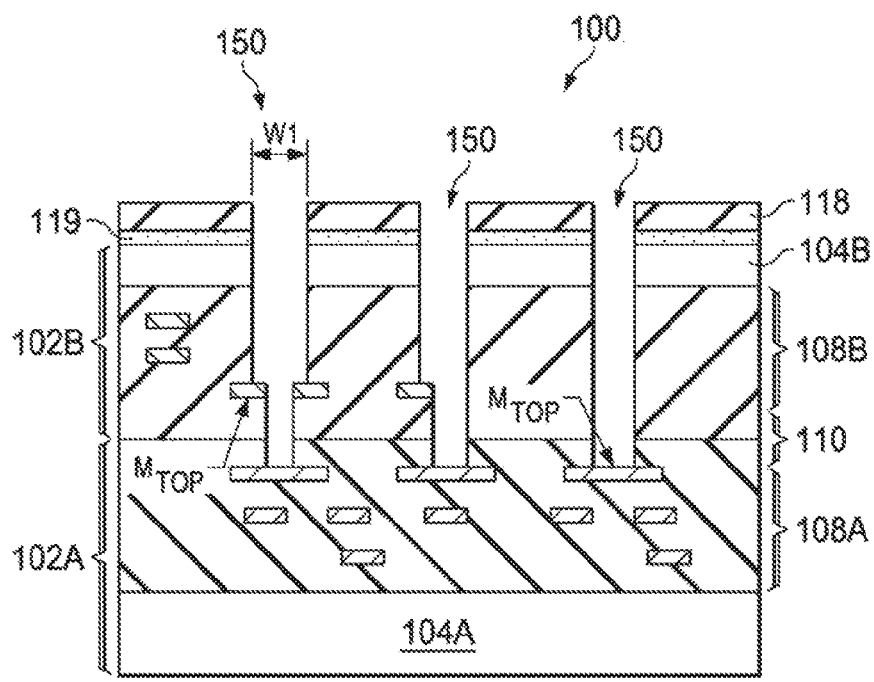

Next, referring to FIG. 5B, via openings 150 are patterned in device 100, for example using a combination of photolithography and etching. Via openings 150 may extend through dielectric layer 118, BARC layer 119, substrate 104B, interconnect layers 108B, and bonding layer 110 to terminate at and expose metal features in metallization layer (e.g., $M_{Top}$ of interconnect layers 108A) in tier 102A. Furthermore, via openings 150 also expose metal features in metallization layers (e.g., $M_{Top}$ of interconnect layers 108B) in tier 102B.

Via openings 150 may be formed using a combination of photolithography and etching in a single patterning process. In some embodiments, via openings 150 may be patterned using a single photomask. Thus, via openings 150 may be self-aligned via openings. For example, a photoresist (not shown) may be disposed over dielectric layer 118 and exposed using a photomask. Exposed or unexposed portions of the photoresist may then be removed depending on whether a positive or negative resist is used. The patterned photoresist may have openings of width W1 over dielectric layer 118. Subsequently, the patterned photoresist may be used as a patterning mask for etching via openings 150.

The etching of via openings 150 may use any suitable wet/dry etching process using a suitable chemical etchant. The chemical etchant may be selected so that metallic materials (e.g., copper) have a higher etch selectivity than dielectric material (e.g., the material of dielectric layer 118 and interconnect layers 108B). Thus, metal features in the metallization layers may act as etch stop layers during the etching process. Thus, via openings 150 may expose, but not etch through, metallization layers in tiers 102A and 102B. Although not illustrated in FIG. 5B, top surfaces of exposed portions metal features in the metallization layers (e.g., $M_{Top}$) may be slightly etched and may be lower than top surfaces of unexposed portions of the relevant metallization layer. Subsequently, the photoresist layer may be removed, for example, using an ashing process. The resulting structure is illustrated in FIG. 5B.

Figure 5C:
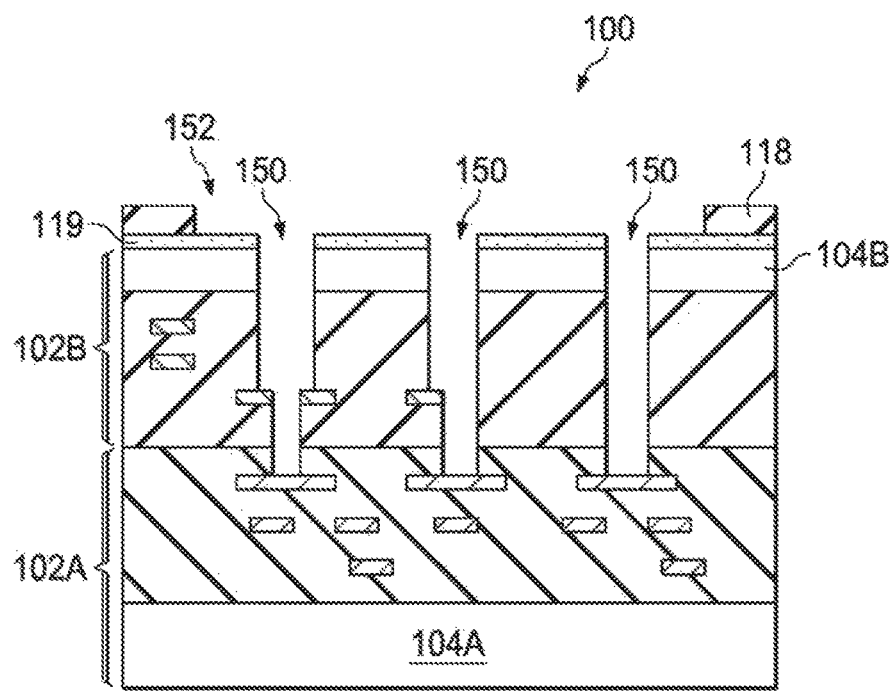
Figure 5D:
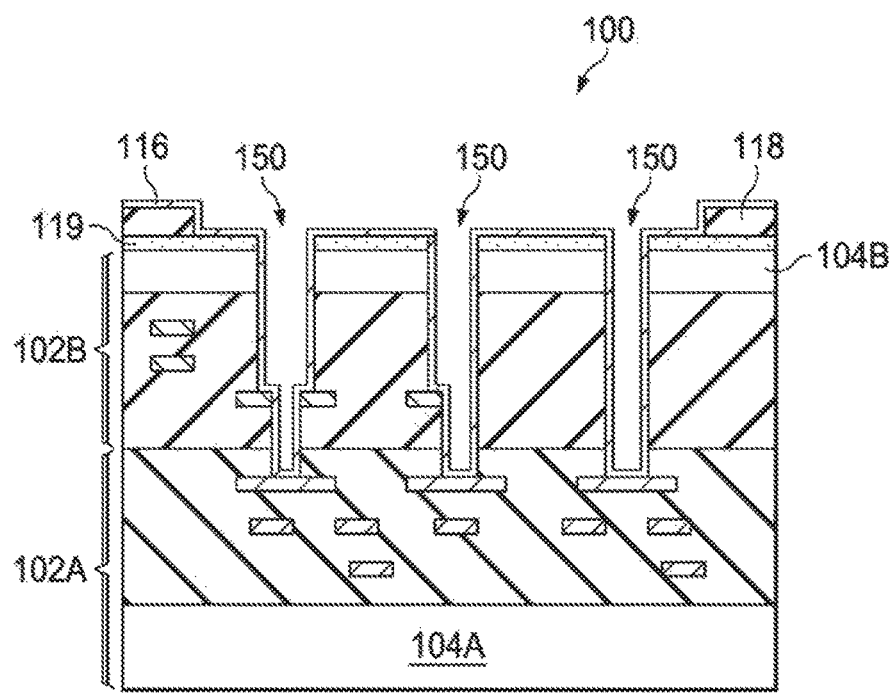

In FIG. 5C, trench opening 152 is patterned in dielectric layer 118 using a combination of photolithography and etching. Trench opening 152 may be connected to via openings 150. Next, as illustrated by FIG. 5D, a barrier layer 116 (e.g., for isolation) is conformably deposited on exposed surfaces of device 100. Suitable conformal deposition processes may include chemical vapor deposition (CVD), plasma enhanced CVD, and the like. Barrier layer 116 may cover sidewalls and bottom surfaces of via openings 150 and trench opening 152. Barrier layer 116 may further cover a top surface of dielectric layer 118.

Figure 5E:
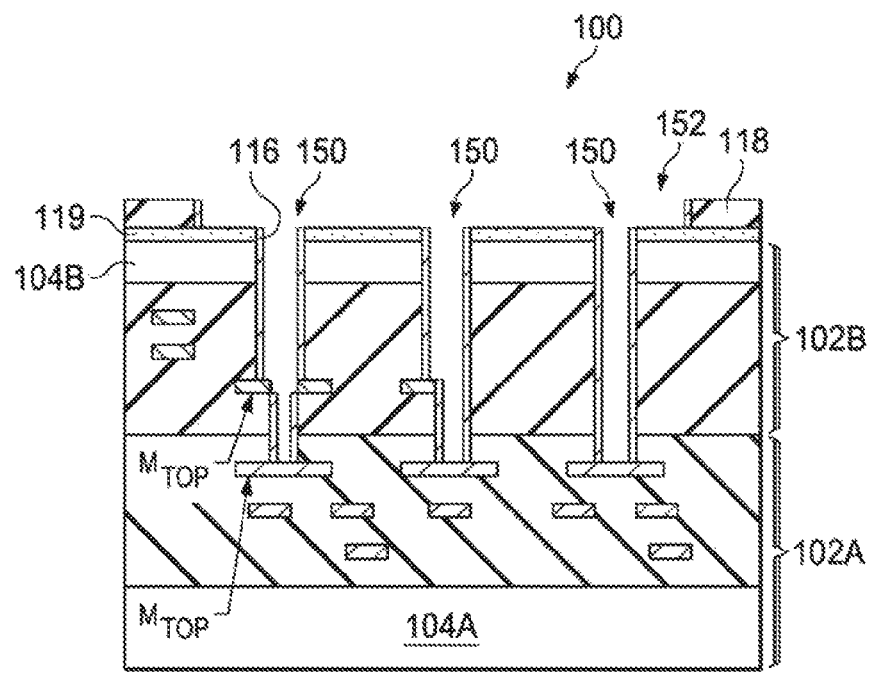
Figure 5F:
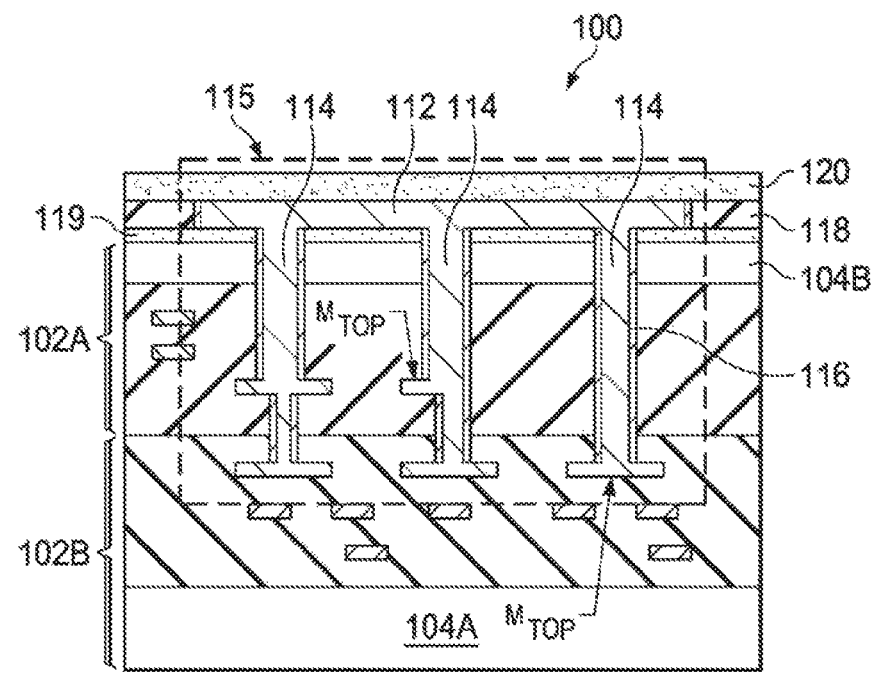

FIG. 5E illustrates the removal of lateral portions of barrier layer 116, for example, using an anisotropic etching process. In some embodiments, the anisotropic etching process may include a dry reactive-ion-etching (RIE) process. After the lateral portions are removed, metallization layers (e.g., $M_{Top}$) may be exposed in via openings 150. Subsequently, trench opening 152 and via openings 150 may be filled with a conductive material (e.g., copper) using any suitable process such as electroless plating. Thus, interconnect structure 115 having a metal trace portion of RDL 112 and ITVs 114A may be formed in device 100 in a single process. A passivation layer 120, which may also be used as a bonding layer, may be formed over the metal trace portion of RDL 112. The resulting structure is illustrated in FIG. 5F.

FIGS. 6 through 11 illustrate cross sectional views of various embodiment device packages including functional tier stacked dies such as device 100. FIG. 6 illustrates details of a direct pillar bump 130 on metal trace feature of some embodiments. As shown, pillar bumps 130 (e.g., copper pillar bumps) are formed directly on the metal trace portion of RDL 112, without requiring contact pads, under bump metallurgy (UBM), or the like, thus further reducing cost and complexity of the device package, which may allow for increased density of pillar bumps 130. For example, in some embodiments, critical dimensions of pillar bumps 130 (e.g., pitch) may be less than about 5 µm, and pillar bumps 130 may have a height less than about 10 µm. Pillar bumps 130 may be formed using any suitable method, such as, depositing a seed layer, forming a UBM (optional), using a mask to define a shape of pillar bumps 130, electro-chemically plating pillar bumps 130 in the mask, and subsequently removing the mask and any undesired portions of the seed layer. Pillar bumps 130 may be used (e.g., as illustrated in FIGS. 7 through 10) to electrically connect device 100 to other package components such as RDLs, package substrates, interposers, printed circuit boards (PCBs), and the like. In other embodiments, other connectors, such as microbumps, C4 bumps, and the like may be used in lieu of pillar bumps 130.

Figure 7:
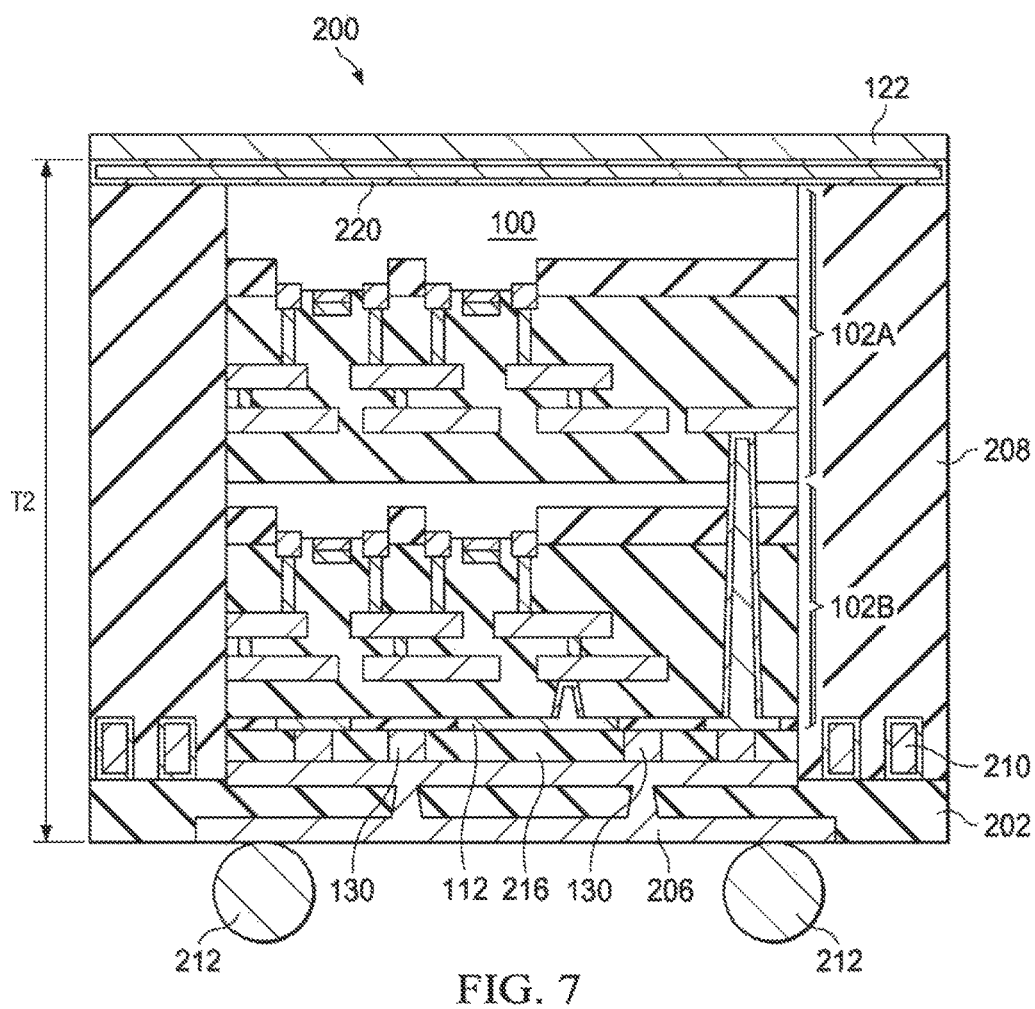
FIG. 7 illustrates an embodiment device structure in a first fan-out device package structure with a 3D stacked system on chip (SoC)

FIG. 7 illustrates another embodiment of a device package 200 employing functional block stacked wafer device (e.g., device 100). This figure shows the packaged flipped relative FIGS. 1 through 5, and hence tier 102B is on the bottom. Pillar bumps 130 on metal trace portions of RDLs 112 bonds device 100 to fan-out RDLs 202. A dielectric layer 216 (e.g., a passivation layer) may be optionally disposed around pillar bumps 130 between device 100 and fan-out RDLs 202. In some embodiments, dielectric layer 216 may comprise a suitable passivation material, such as a polymer (e.g., PI, PBO, BCB, epoxy, silicone, acrylates, nano-filled pheno resin, siloxane, a fluorinated polymer, polynorbornene, and the like), an underfill, a molded underfill, and the like. Alternatively, dielectric layer 216 may be omitted. Fan-out RDLs 202 may include one or more interconnect layers 206, for example, having metal lines/traces and vias, which may be micro-vias formed in a dielectric material, such as a polymer (e.g., PI, PBO, BCB, epoxy, silicone, acrylates, nano-filled pheno resin, siloxane, a fluorinated polymer, polynorbornene, and the like). A molding compound 208 may surround and encircle device 100 and other devices in package 200. In alternative embodiments, molding compound 208 may comprise an organic material such as, FR4 (or other epoxy laminate), ABF (ammonium biflouride), and the like. A thermal dissipation layer 122 (e.g., a TIM comprising copper, nickel, graphine, and the like) may be disposed over device 100 and molding compound 208. An adhesive layer 220 may be used to attach thermal dissipation layer 122 to device 100 and molding compound 208. Package 200 may have a thickness T2 of less than about 200 µm, for example, in embodiments where device 100 includes two tiers 102. Of course, package 200 may have other dimensions in alternative embodiments based on package design. Connectors 212 may electrically connect package 200 to another package component such as a PCB, interposer, package substrate, motherboard, and the like.

Figure 8:
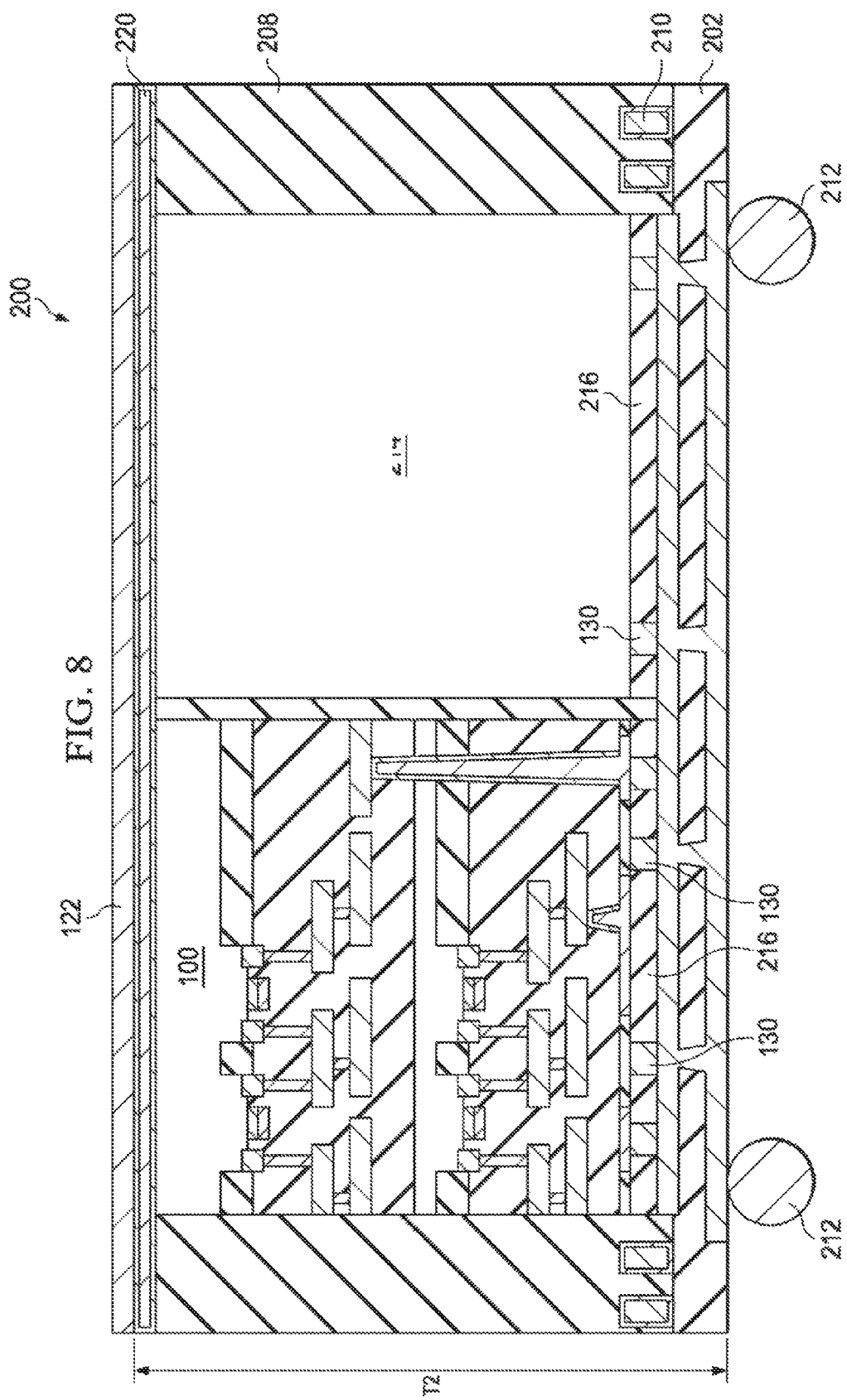
FIG. 8 illustrates an embodiment device structure in a second fan-out device package structure with multiple 3D stacked system on chip (SoC) and other integrated circuits (IC)

Fan-out RDLs 202 can extend beyond device 100 to include other dies placed in a "horizontal" configuration, as shown in FIGS. 7 and 8. For example, interconnect layers 206 electrically connect device 100 to other devices such as passive devices 210 (illustrated in FIG. 7) and/or other active functional devices 214 (illustrated in FIG. 8), and the like. Passive devices 210 may be integrated passive devices (IPDs), discrete passive devices, and the like. Active functional devices 214 devices may be logic, analog, radio-frequency devices, and the like. Connectors 212 may be formed on a surface of RDLs 202 opposing device 100. The teaching of FIG. 7 could be further expanded to include multiple die connected horizontally and even multiple stacked die interconnected horizontally (i.e., two or more packages shown in FIG. 7 could be placed side by side and interconnected in the manner shown in FIG. 8).

Package 200 may be formed using any suitable methods. For a carrier may be provided, and fan-out RDLs 202 may be formed on the carrier. The formation of fan-out RDLs 202 may include forming one or more dielectric layers using any suitable method (e.g., a spin-on coating technique, sputtering, and the like) and forming conductive features in the dielectric material. The formation of the conductive features may include patterning the dielectric material (e.g., using photolithography and/or etching processes) and forming conductive features in the patterned dielectric layers (e.g., by depositing a seed layer, using a mask layer to define the shape of the conductive features, and using an electroless/electrochemical plating process).

Subsequently, device 100 may be bonded to fan-out RDLs 202 using pillar bumps 130, for example. Additional devices (e.g., passive devices 210 of FIG. 7 and/or active functional devices 214 of FIG. 8) may also be bonded to fan-out RDLs 202 using any suitable method. A wafer level molding and molding grind back is then performed. For example, molding compound 208 is dispensed around device 100 and to fill gaps between device 100 and other devices (e.g., passive devices 210 and/or active functional devices 214). Suitable methods for forming molding compound 208 may include compressive molding, transfer molding, liquid encapsulent molding, and the like. For example, molding compound 208 may be dispensed in liquid form. Subsequently, a curing process is performed to solidify molding compound 208. The formation of molding compound 208 may overflow device 100 so that molding compound 208 covers top surfaces of device 100. A mechanical grinding, chemical mechanical polish (CMP), or other etch back technique may be employed to remove excess portions of molding compound 208 and a surface expose device 100. After planarization, top surfaces of molding compound 208 and device 100 may be substantially level.

Additional package features may then be formed. For example, thermal dissipation features 122, additional fan-out RDLs (not shown), and the like may be formed over molding compound 208 and device 100. Furthermore, the carrier may be removed, and external connectors 212 may be formed on conductive features in RDLs 202. Connectors 212 may be BGA balls and may be used to bond device package 200 to other package components, such as, a printed circuit board. Package 200 may be sawed from other device packages (not shown) in a package wafer along scribe lines. Thus, package the various features of package 200 may be formed in an example embodiment.

Figure 9:
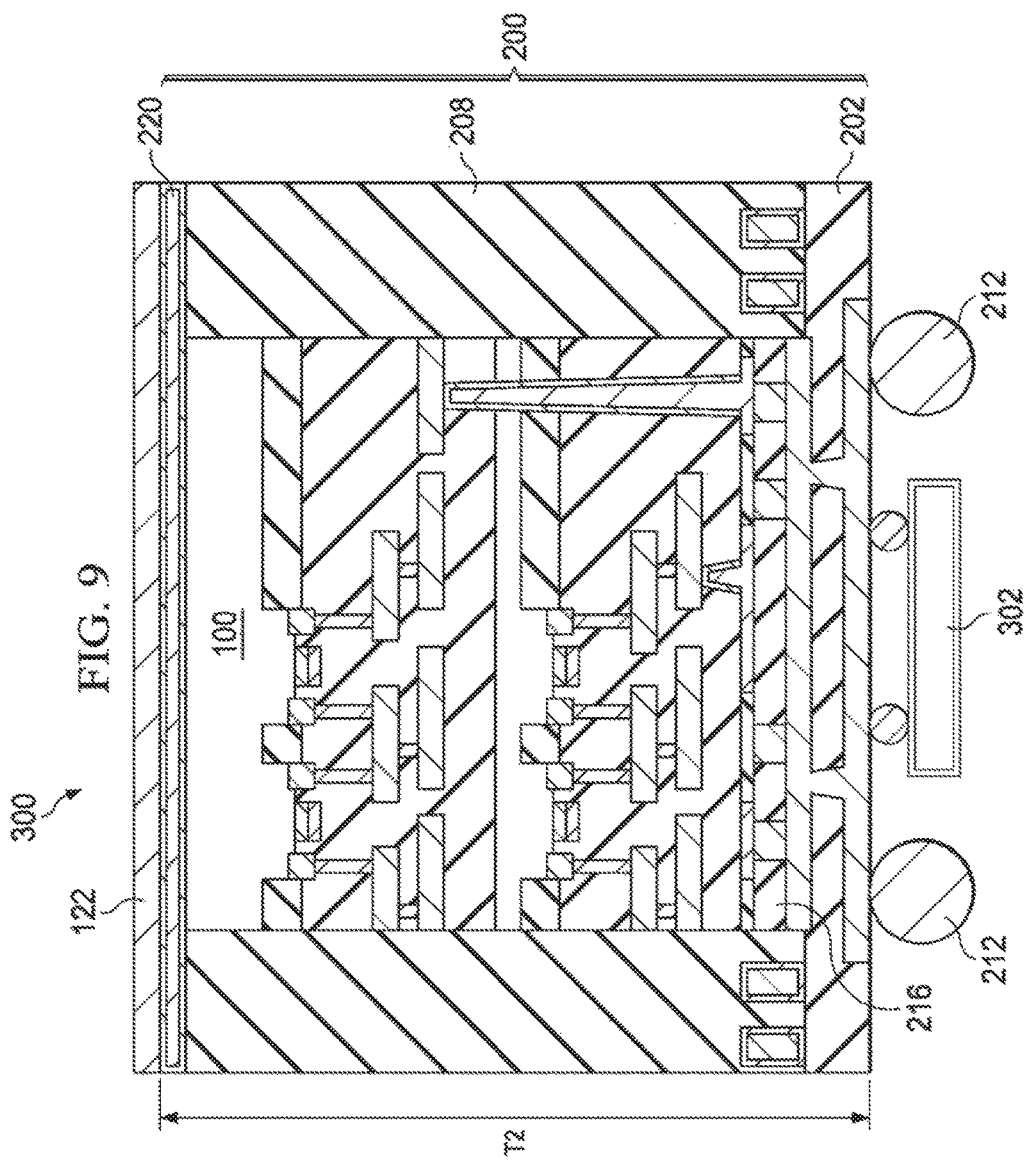
FIG. 9 illustrates an embodiment device structure in a third fan-out device package structure with wide IO memory attached to the bottom of a first or second fan-out device package structure.

FIG. 9 illustrates an embodiment package 300 where fan-out packaging structures are expanded to include a chip-on-chip (CoC) configuration. As shown, a device package, such as the package 200 shown in FIG. 7 (or any illustrated embodiment) can be interconnected in a CoC fashion to one or more integrated circuit dies 302, such as a wide input/output (I/O) memory chip. In some embodiments, die 302 may be disposed on a surface of fan-out RDLs 202 opposing device 100. Other configurations may also be used. In FIGS. 7, 8, and 9, the device 100 and other components are bonded to RDLs 202 with pillar bumps 130. Alternatively the device 100 and other components can also be oriented with pillar bump 130 face up, such that RDLs 202 is formed thereon to interconnect to pillar bump 130 through any alternative suitable fan-out process (not explicitly illustrated in the drawings).

Figure 10A:
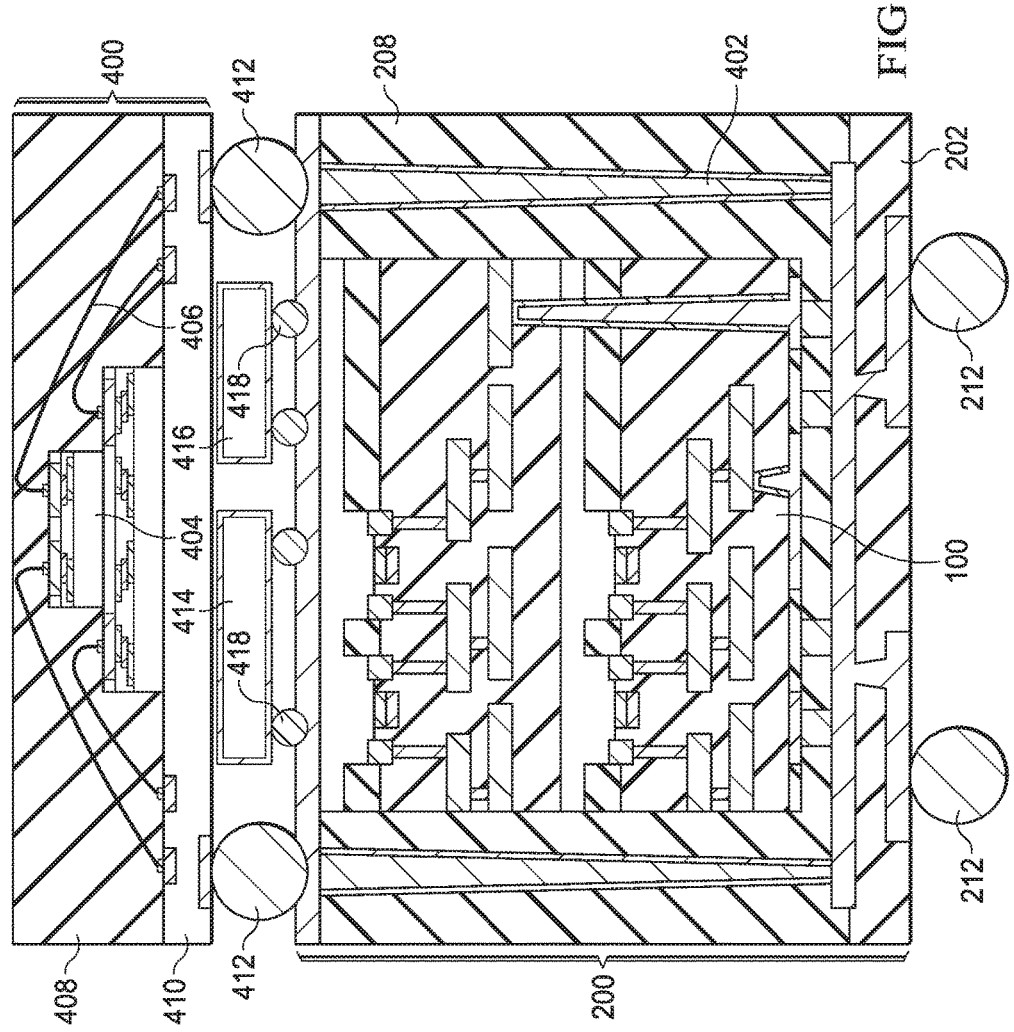
FIGS. 10A and 10B illustrate an embodiment where the fan-out device package extends to first package on package (PoP) device structure.
Figure 10B:
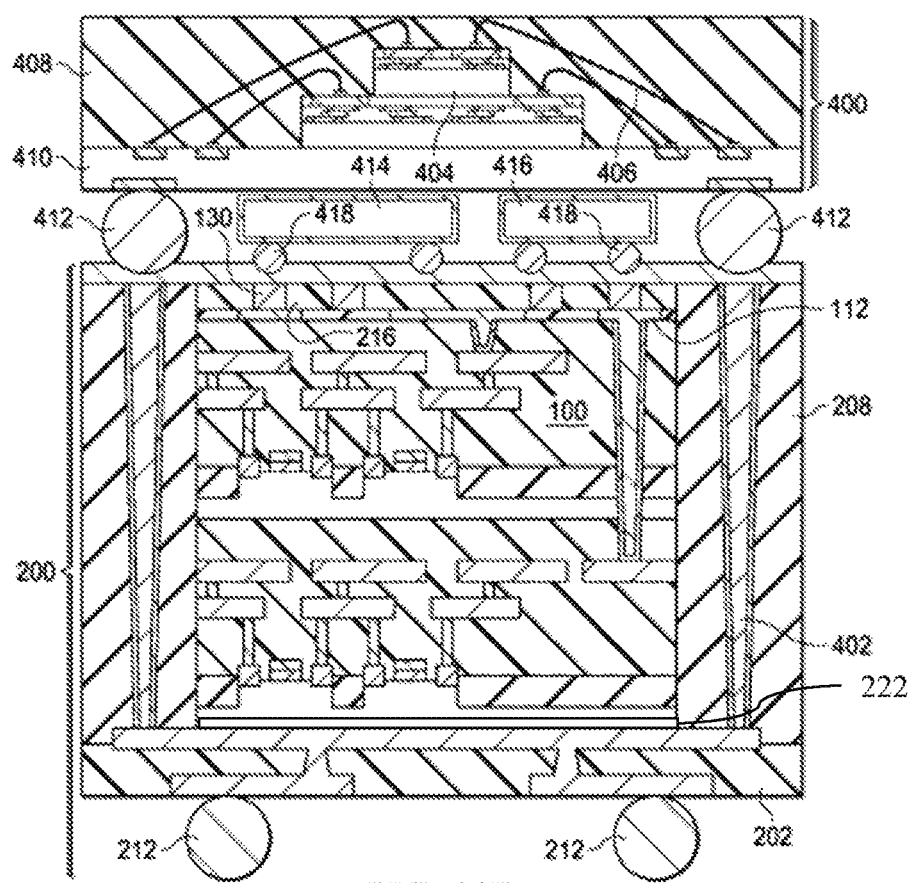
Figure 11:
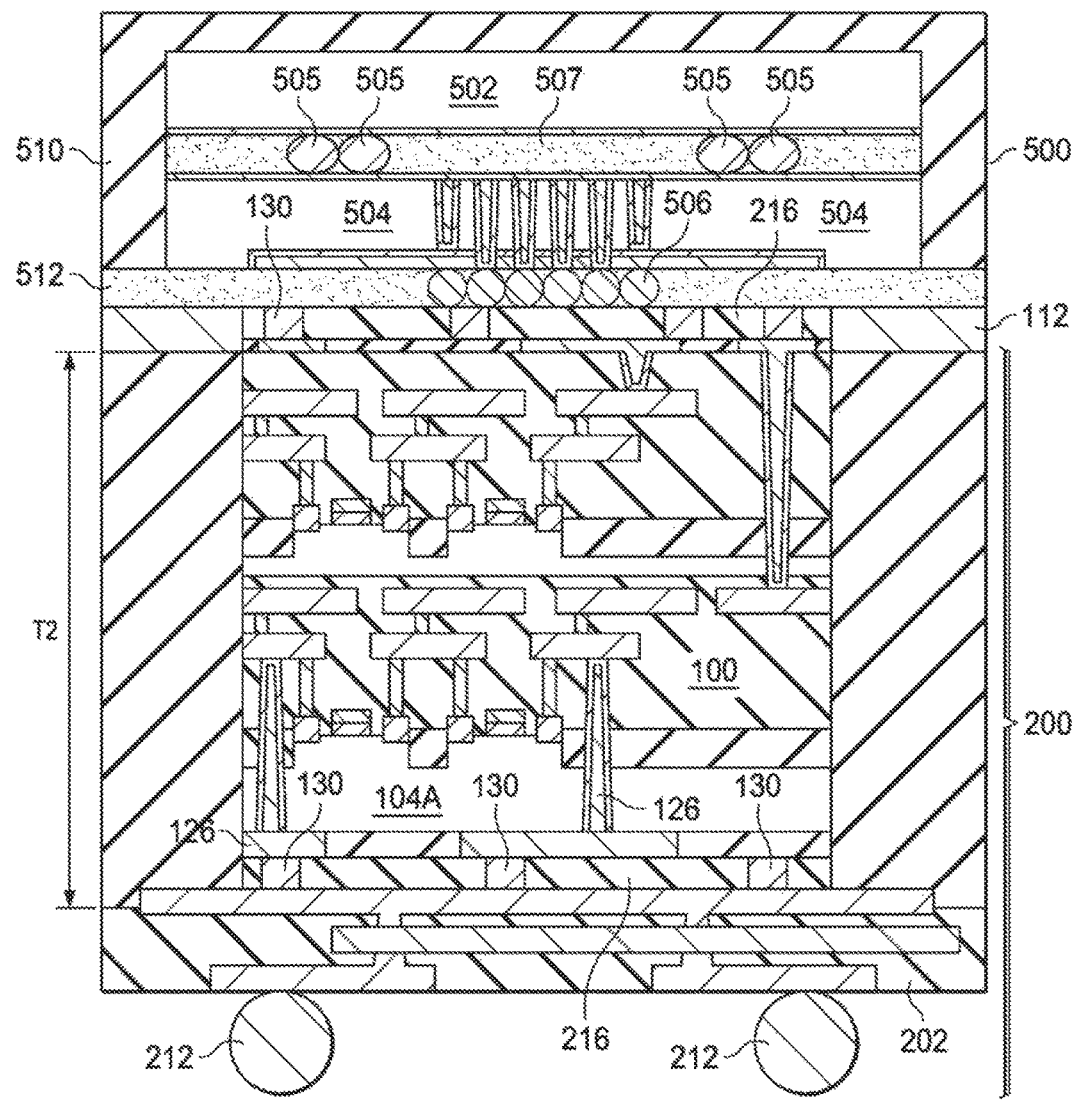
FIG. 11 illustrates an embodiment where the fan-out device package extends to a second package on package (PoP) device structure.

Likewise, fan-out packaging structures can extend to package on package (PoP) devices as well, as shown in FIGS. 10A, 10B, and 11. The device package package 200 shown in FIG. 7 (or other embodiments) can have mounted thereon additional chips and even additional device packages, as shown. Although FIG. 10A does not illustrate the inclusion of a dielectric layer 216 between pillar bumps 130, such a dielectric layer may be included in alternative embodiments (e.g., see FIG. 10B). The orientation of device 100 in package 200 may vary. For example, pillar bumps 130 may be disposed on RDLs 112, which may be oriented facing towards fan-out RDLs 202 (as illustrated in FIG. 10A) or orientated facing towards a device package 400 (as illustrated in FIG. 10B). Furthermore, in the embodiment orientation illustrated by FIG. 10B, an adhesive layer 222 may be used to attach device 100 to RDLs 202.

FIGS. 10A and 10B also shows the inclusion of through molding compound vias (TMVs) 402 to provide electrical interconnection to the various device packages. As but one illustrative example, the device package 400 could be a low power-double data rate X (LP-DDR$_x$) package. Device package 400 may include stacked dynamic random access memory (DRAM) chips 404 electrically connected to a package substrate 410 through wire bonds 406. Molding compound 408 may protectively encase DRAM chips 404 and wire bonds 406. Peripheral connectors 412 or a ball grid array (BGA) connector scheme on substrate 410 may electrically connect and bond package 400 to package 200. Additional chips 414 and 416, which may include functional chips (e.g., wide IO chips) and/or passive device chips (e.g., IPDs) may also be bonded to package 200 using connectors 418, which may be microbumps, C4 bumps, and the like.

FIG. 11 illustrates yet another example embodiment. The device package 200 shown in FIG. 7 (or other embodiments) can have mounted thereon additional chips and even additional device packages, as shown. As but one illustrative example, a device package 500 could be another chip stack package (e.g., a wide IO memory stack). Device package 500 may include one or more chips 502, which may be wide IO memory chips, other memory chips, logic chips, and the like electrically connected to a TSV chip 504 through connectors 505 (e.g., microbumps, C4 bump, and the like). Underfill 507 may be dispensed between chip 502 and TSV chip 504 around connectors 505.

Molding compound 510 may protectively encase chip 502 and TSV chip 504. Peripheral connectors 506 (e.g., microbumps, C4 bumps, or the like) on TSV chip 504 may electrically connect and bond package 500 to package 200. Interconnect structures in TSV chip 504 may help electrically connect chip 502 with package 200. As illustrated in FIG. 11, connectors 506 may electrically connect and bond to fan-out RDLs 512, which may be electrically connected to pillar bumps 130 on RDLs 112 of device 100. Furthermore additional pillar bumps 130 may be disposed on back side interconnect structures on a back surface of substrate 104A, and such additional pillar bumps 130 may be electrically connected to active devices in device 100 through TSVs 126. Underfill 508 (not shown in FIG. 11) may be disposed between package 500 and package 200 between connectors 506. Other packaged configurations of device 100 (e.g., packaged in package 200) will be apparent to those skilled in the art using routine experimentation once informed by the present disclosure.

Thus, various embodiments may enable lower power and higher input/output (I/O) interconnections for system partition and integration by using one or more stacked functional tiers. Active devices and interconnect layers in each tier may be interconnected to provide various functional circuits (e.g., logic, memory, external I/O, network connectivity, and the like). Various tiers may be bonded using a bonding layer (e.g., an oxide-to-oxide bonding layer, a copper-to-copper bonding layer, and the like), and interconnect structures (e.g., having TSVs, TOVs, ITVs, and RDLs) may provide electrical interconnections between functional circuits of the various tiers in the device. Various tiers of the device may include an array of interconnected functional circuits, which may allow for various applications. The device may further be packaged with other package components using fan-out, CoC, PoP, and the like techniques. The various configurations of devices as described above may provide one or more of the following non-limiting advantages: greater design flexibility, improved yield, lower production costs, increased I/O density, increased active device density, improved thermal management, and the like.

In accordance with an embodiment, a device package includes a fan-out redistribution layer (RDL), a device over and bonded to the fan-out RDL, and a molding compound over the fan-out RDL and extending along sidewalls of the device. The device includes a first functional tier having a first substrate, first active devices on the first substrate, and a first metallization layer electrically connecting the first active devices. The device further includes a second functional tier having a second substrate, second active devices on the second substrate, and a second metallization layer electrically connecting the second active devices. The second functional tier is bonded to the first functional tier. The device further includes an interconnect structure electrically connecting the first metallization layer to the second metallization layer. The interconnect structure includes an inter-tier via (ITV) at least partially disposed in both the first functional tier and the second functional tier, and the ITV contacts the first metallization layer.

In accordance with another embodiment, a device package includes a device, one or more pillar bumps on the device, one or more fan-out redistribution layers (RDLs) electrically connected to the one or more pillar bumps, and one or more package components. The one or more package components are electrically connected to the first device through the one or more fan-out RDLs. The first device includes a first functional tier, a second functional tier, and a bonding layer disposed between the first functional tier and the second functional tier. The bonding layer bonds the first functional tier to the second functional tier. The first device further includes an interconnect structure at least partially disposed in the first functional tier and the second functional tier. The interconnect structure electrically connects first functional circuits in the first functional tier to second functional circuits in the second functional tier.

In accordance with yet another embodiment, a method includes forming a device. Forming the device includes bonding a first functional tier to a second functional tier, forming a first redistribution layer (RDL) over the second functional tier, forming an interconnect structure in the first and the second functional tier, and forming a pillar bump on a first conductive feature in the first RDL. The interconnect structure electrically connects a first metallization layer in the first functional tier, a second metallization layer in the second functional tier, and the RDL. The method further includes bonding the device to a fan-out RDL by bonding the pillar bump to a second conductive feature in the fan-out RDL. The method also further includes forming a fan-out RDL to electrically interconnect pillar bump in the first functional tier.

In accordance with an embodiment, a device package includes a first die and a second die directly bonded to the first die. The first die includes a first substrate, a first active device on the first substrate, and a first interconnect structure having a first conductive feature electrically connected to the first active device. The second die includes a second substrate, a second active device on the second substrate, and a second interconnect structure having a second conductive feature electrically connecting the second active device. The device package also includes a conductive via at least partially disposed in both the first interconnect structure and the second interconnect structure. The conductive via electrically connects the first conductive feature to the second conductive feature. The device package also includes fan-out redistribution layers extending laterally past the first die and the second die. The fan-out redistribution layers are electrically connected to the first conductive feature, the second conductive feature, and the conductive via.

In accordance with an embodiment, a method includes directly bonding a first die to a second die to form a device and forming an interconnect structure at least partially disposed in the first die and the second die. The interconnect structure electrically connects first functional circuits in the first die to second functional circuits in the second die. The method further includes forming one or more pillar bumps on the device and electrically connecting the device to one or more fan-out redistribution layers using the one or more pillar bumps. The method also includes electrically connecting one or more package components to the device through the one or more fan-out redistribution layers.

In accordance with an embodiment, a method includes bonding a first die to a second die and electrically connecting a first conductive feature in the first die to a second conductive feature in the second die with a first conductive via. The first conductive via extends at least partially through the first die and the second die. The method also includes bonding the first die and the second die to a fan-out redistribution layer. The fan-out redistribution layer extends laterally past the first die and the second die. The method also includes dispensing a molding compound over the fan-out redistribution layer. The molding compound extends along sidewalls of the first die and the second die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device package comprising:
   a first die comprising:
      a first substrate;
      a first active device on the first substrate; and
      a first interconnect structure comprising a first conductive feature electrically connected to the first active device;
   a second die directly bonded to the first die, wherein the second die comprises:
      a second substrate;
      a second active device on the second substrate; and
      a second interconnect structure comprising a second conductive feature electrically connecting the second active device;
   a conductive via at least partially disposed in both the first interconnect structure and the second interconnect structure, wherein the conductive via electrically connects the first conductive feature to the second conductive feature; and
   fan-out redistribution layers extending laterally past the first die and the second die, wherein the fan-out redistribution layers are electrically connected to the first conductive feature, the second conductive feature, and the conductive via.

2. The device package of claim 1, further comprising a bonding layer bonding the first die to the second die, wherein the bonding layer is substantially free of any electrical connectors, and wherein the bonding layer comprises an oxide, poly or single crystal silicon (Si), silicon nitride (SiN), silicon carbide (SiC), titanium (Ti), copper (Cu), titanium nitride (TiN), alloys thereof, or a combination thereof.

3. The device package of claim 1, wherein the first substrate and the second substrate comprise different thicknesses.

4. The device package of claim 1 further comprising a molding compound extending along sidewalls of the first die and the second die.

5. The device package of claim 4 further comprising a through-via extending through the molding compound, wherein the through-via electrically connects the fan-out redistribution layers to the first die and the second die.

6. The device package of claim 4 further comprising a passive device adjacent the first die and electrically connected to the fan-out redistribution layers, wherein the molding compound extends along sidewalls of the passive device.

7. The device package of claim 1, further comprising a plurality of pillar bumps between the first die and the fan-out redistribution layers, wherein the plurality of pillar bumps electrically connect the fan-out redistribution layers to the first die and the second die.

8. The device package of claim 1 further comprising:
   a conductive line on an opposing side of the second substrate as the first die, wherein the conductive via extends from the conductive line through the second die to the first conductive feature; and
   an additional conductive via extending from the conductive line to second conductive feature, wherein the additional conductive via is electrically connected to the conductive via through the conductive line.

9. The device package of claim 1, the conductive via contacts both the first conductive feature and the second conductive feature.

10. The device package of claim 9, wherein a first end of the conductive via contacts the first conductive feature and a second end of the conductive via contacts the second conductive feature.

11. A method comprising:
  directly bonding a first die to a second die to form a device;
  forming an interconnect structure at least partially disposed in the first die and the second die, wherein the interconnect structure electrically connects first functional circuits in the first die to second functional circuits in the second die;
  forming one or more pillar bumps on the device;
  electrically connecting the device to one or more fan-out redistribution layers using the one or more pillar bumps; and
  electrically connecting one or more package components to the device through the one or more fan-out redistribution layers.

12. The method of claim 11, wherein the one or more pillar bumps is electrically connected to the device without any intervening under bump metallurgy or contact pad features.

13. The method of claim 11, wherein one or more package components comprises a passive device, an active device, a device chip, a package substrate, an interposer, another device package, or a combination thereof.

14. The method of claim 11, wherein the second die a semiconductor substrate, and wherein the method further comprises thinning the semiconductor substrate after bonding the first die to the second die.

15. The method of claim 11, wherein bonding the first die to the second die comprises using a semiconductor substrate of the first die as structural support without using an additional carrier for structural support.

16. A method comprising:
  bonding a first die to a second die;
  electrically connecting a first conductive feature in the first die to a second conductive feature in the second die with a first conductive via, wherein the first conductive via extends at least partially through the first die and the second die;
  bonding the first die and the second die to a fan-out redistribution layer, wherein the fan-out redistribution layer extends laterally past the first die and the second die; and
  dispensing a molding compound over the fan-out redistribution layer, wherein the molding compound extends along sidewalls of the first die and the second die.

17. The method of claim 16, wherein electrically connecting the first conductive feature to the second conductive feature comprises patterning a via opening using a single photomask, wherein the via opening extends through the second die and at least partially through the first die, and wherein the via opening at least partially exposes the first conductive feature and the second conductive feature.

18. The method of claim 17, further comprising forming a RDL over the second die, wherein forming the RDL and electrically connecting the first conductive feature to the second conductive feature further comprises:
  forming a dielectric layer over the second die;
  patterning a trench opening in the dielectric layer, wherein the trench opening is connected to the via opening;
  forming a barrier layer over sidewalls and bottom surfaces of the trench opening and the via opening;
  removing lateral portions of the barrier layer; and
  filling the trench opening and the via opening with a conductive material.

19. The method of claim 16 further comprising:
  forming a redistribution layer over the second die, wherein the first conductive via is electrically connected to the redistribution layer; and
  forming one or more pillar bumps on the redistribution layer, wherein the one or more pillar bumps electrically connects the first die and the second die to the fan-out redistribution layers.

20. The method of claim 19 further comprising forming a second conductive via extending through the molding compound, wherein the second conductive via electrically connects the one or more pillar bumps to the fan-out redistribution layers.

* * * * *